US012777831B2

(12) United States Patent
Jang et al.

(10) Patent No.: US 12,777,831 B2
(45) Date of Patent: Oct. 27, 2026

(54) MASK-SUPPORT ASSEMBLY AND PRODUCING METHOD THEREOF

(71) Applicant: Olum Material Corporation, Yongin-si (KR)

(72) Inventors: Taek Yong Jang, Seongnam-si (KR); Young Ho Lee, Yongin-si (KR)

(73) Assignee: Olum Material Corporation, Yongin-si (KR)

( * ) Notice: Subject to any disclaimer, the term of this patent is extended or adjusted under 35 U.S.C. 154(b) by 238 days.

(21) Appl. No.: 18/393,508

(22) Filed: Dec. 21, 2023

(65) Prior Publication Data

US 2025/0063931 A1 Feb. 20, 2025

(30) Foreign Application Priority Data

Aug. 18, 2023 (KR) ........................ 10-2023-0108074

(51) Int. Cl.
*C25D 1/10* (2006.01)
*H10K 71/16* (2023.01)

(52) U.S. Cl.
CPC ............. *H10K 71/166* (2023.02); *C25D 1/10* (2013.01)

(58) Field of Classification Search
USPC .......................................... 118/721, 504, 505
See application file for complete search history.

(56) References Cited

U.S. PATENT DOCUMENTS 4,599,970 A * 7/1986 Peterson ................. B05C 13/02 118/721
11,638,388 B2 4/2023 Dong et al.
12,058,922 B2 8/2024 Sone et al.
2021/0359210 A1* 11/2021 Dong .................... B05C 21/005

FOREIGN PATENT DOCUMENTS

| | | | | |
|---|---|---|---|---|
| JP | 3678199 B2 * | 8/2005 | | G03F 1/20 |
| JP | 2020521058 A * | 7/2020 | | H01L 21/027 |
| JP | 2022-175723 | 11/2022 | | |
| KR | 10-1676367 | 11/2016 | | |
| KR | 10-2018-0087824 | 8/2018 | | |
| KR | 10-2020-0065462 | 6/2020 | | |
| KR | 10-2021-0037717 | 4/2021 | | |
| KR | 10-2021-0141416 | 11/2021 | | |
| KR | 20210142840 A * | 11/2021 | | C23C 14/042 |
| KR | 10-2022-0136681 | 10/2022 | | |

OTHER PUBLICATIONS

English Translation JP-20200521058A (Year: 2020).*
English Translation JP3678199B2 (Year: 2005).*
English Translation KR-20210142840A (Year: 2021).*
Office Action for Korean Intellectual Property Office dated Jul. 2, 2024.

* cited by examiner

*Primary Examiner* — Yewebdar T Tadesse

(57) ABSTRACT

The present invention relates to a mask-support assembly and a producing method thereof. The mask-support assembly according to the present invention is used in a process of forming organic light emitting diode (OLED) pixels on a semiconductor wafer, and may include a support including an edge portion and a grid portion; and a mask connected onto the support and including a plurality of cell portions with mask patterns formed therein, wherein at least a part of the mask is disposed in a trench portion recessed in the support.

8 Claims, 21 Drawing Sheets

(a)

(b)

(a)

(b)

(c)

(a)

(b)

MASK-SUPPORT ASSEMBLY AND PRODUCING METHOD THEREOF

CROSS-REFERENCE TO RELATED APPLICATION(S)

This application claims the benefit under 35 USC § 119 (a) of Korean Patent Application No. 10-2023-0108074, filed on Aug. 18, 2023, in the Korean Intellectual Property Office, the entire disclosure of which is herein incorporated by reference for all purposes.

BACKGROUND

1. Field

The following description relates to a mask-support assembly and a producing method thereof. More specifically, the following description relates to a mask-support assembly that is used in forming pixels on a semiconductor wafer and enables a mask pattern of ultra-high resolution to be precisely formed, and a producing method thereof.

2. Description of Related Art

As a pixel deposition technique in an organic light-emitting diode (OLED) manufacturing process, a fine metal mask (FMM) method for positioning a thin metal mask (or a shadow mask) in contact with or very close to a substrate and depositing an organic material at desired locations is commonly used.

In a conventional OLED manufacturing process, after a mask thin film is prepared, a mask is welded and fixed to an OLED pixel deposition frame and then is used. In the fixing process, there is a problem in that the mask of a large area is not well aligned. Also, in the process of welding and fixing the mask to the frame, there is a problem in that the mask sags or twists with the load since the mask film is too thin and has a large area.

In an ultra-high-resolution OLED manufacturing process, small defects of several μm may lead to pixel deposition failure, and thus there is a need to develop technology that is capable of preventing deformation of a mask, such as sagging or twisting of a mask, and clearly aligning the mask.

Recently, a microdisplay which is applied to a virtual reality (VR) device has drawn attention. A microdisplay is required to provide a much smaller screen size than those of the existing displays and still realize high quality within the small screen in order to display an image directly in front of a user's eye in a VR device. Therefore, smaller mask patterns than those of a mask used in the existing ultra-high-resolution OLED manufacturing process and a finer alignment of the mask before a pixel deposition process are required.

SUMMARY

Therefore, the present invention is devised to solve the above-mentioned problems of the related art and provides a mask-support assembly capable of realizing ultra-high definition pixels of a microdisplay, and a producing method thereof.

Moreover, an object of the present invention is to provide a mask-support assembly capable of enhancing stability of pixel deposition by allowing a mask to be clearly aligned, and a producing method thereof.

However, these objects are merely illustrative, and the scope of the present invention is not limited thereto.

The present invention provides a mask-support assembly for use in a process of forming organic light emitting diode (OLED) pixels on a semiconductor wafer, the mask-support assembly including a support including an edge portion and a grid portion; and a mask connected onto the support and including a plurality of cell portions with mask patterns formed therein, wherein at least a part of the mask is disposed in a trench portion recessed in the support.

The support and the mask may have a circular shape, and the grid portion may include a plurality of first grid portions extending in a first direction and having both ends connected to the edge portion; and a plurality of second grid portions extending in a second direction perpendicular to the first direction, intersecting with the first grid portions, and having both ends connected to the edge portion.

The mask may include a dummy portion connected onto the edge portion; a plurality of cell portions disposed at a central part of the mask and including a plurality of mask patterns; and separation portions positioned closer to the central part of the mask than the dummy portion and disposed between the plurality of cell portions, and the separation portions may be supported on the grid portion.

The dummy portion and the edge portion may share the same upper surface.

A recessed dummy trench may be formed on the grid portion.

A portion of the mask corresponding to the separation portion may be disposed within the dummy trench portion, allowing the separation portion and the grid portion to share at least the same upper surface.

The support may be formed from a silicon wafer, the mask may be formed on the silicon wafer by electroforming, and a connection portion including Ni and Si or a connection portion including Fe, Ni, and Si may be interposed between the support and the mask.

An auxiliary connection portion including at least one of Ni, Cu, Ti, Au, Ag, Al, Sn, In, Bi, Zn, Sb, Ge, or Cd may be further interposed between the connection portion and the mask, and a thickness of the auxiliary connection portion may be in a range of 0.01 μm to 0.2 μm.

A crystal orientation of a (100) plane or (111) plane of the silicon wafer may not be parallel to a longitudinal direction of the first grid portions or the second grid portions.

Also, the present invention provides a producing method of a mask-support assembly for use in a process of forming OLED pixels on a semiconductor wafer, the producing method including the steps of: (a) preparing a support which includes a first surface and a second surface opposite to the first surface and is a conductive substrate; (b) forming a recessed trench portion on the first surface; (c) forming a mask on the first surface of the support by electroforming; (d) performing heat treatment on the support and the mask; and (e) forming an edge portion and a grid portion by etching the support on the second surface of the support, wherein in step (c), the mask is formed at least within the trench portion.

In step (b), a plurality of trench portions may be formed in a patterned shape, and a portion between neighboring trench portions may be provided as a mask pattern of the mask.

Step (b) may include (b1) forming first insulating portions on the first surface of the support; and (b2) forming the trench portion by etching the support exposed between the first insulating portions.

In step (c), the electroforming may be performed such that an upper end of the mask is positioned higher than the first surface and lower than an upper end of the first insulating portion.

The producing method may further include, between steps (b) and (c), removing the first insulating portion, and in step (c), the electroforming may be performed such that an upper end of the mask is positioned higher than the first surface of the support.

Step (c) may include (c1) forming a first mask layer with Ni content greater than 60 wt % on at least a portion of a bottom surface and side surfaces of the trench portion by applying a first current density; and (c2) forming a second mask layer of a Fe—Ni alloy material with Ni content of 36 wt % to 42 wt % on the first mask layer by applying a second current density different from the first current density.

A thickness of the first mask layer may be 2% to 20% of a thickness of the second mask layer.

Step (c) may further include (c3) forming a third mask layer with Ni content greater than 60 wt % on the second mask layer by applying the first current density different from the second current density, and a thickness of the third mask layer may be 2% to 20% of a thickness of the second mask layer.

After the heat treatment of step (d), the support and the mask may be connected to each other with a connection portion including Ni and Si, or a connection portion including Fe, Ni, and Si, interposed therebetween, and the heat treatment of step (d) may be performed at a temperature of 100° C. to 800° C.

The connection portion may be formed between the mask and at least a portion of a bottom surface and side surfaces of the trench portion.

In step (b), a recessed dummy trench portion may be further formed on the support that corresponds to a region where the grid portion is to be formed, and in step (c), the mask may be formed within at least the trench portion and the dummy trench portion.

Other features and aspects will be apparent from the following detailed description, the drawings, and the claims.

Figure 1:
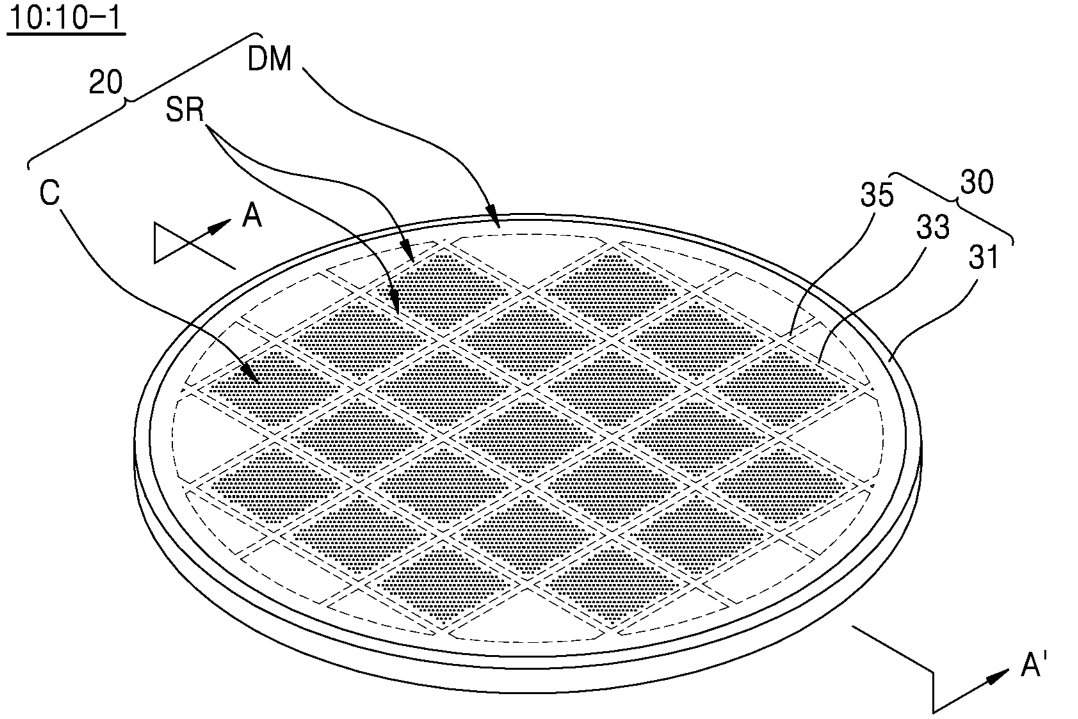
FIG. 1 is a schematic view showing a mask-support assembly according to an embodiment of the present invention.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed descriptions of the invention will be made with reference to the accompanying drawings illustrating specific embodiments of the invention by way of example. These embodiments will be described in detail such that the invention can be carried out by one of ordinary skill in the art. It should be understood that various embodiments of the invention are different, but are not necessarily mutually exclusive. For example, a specific shape, structure, and characteristic of an embodiment described herein may be implemented in another embodiment without departing from the scope of the invention. In addition, it should be understood that a position or placement of each component in each disclosed embodiment may be changed without departing from the scope of the invention. Accordingly, there is no intent to limit the invention to the following detailed descriptions. The scope of the invention is defined by the appended claims and encompasses all equivalents that fall within the scope of the appended claims. In the drawings, like reference numerals denote like functions, and the dimensions such as lengths, areas, and thicknesses of elements may be exaggerated for clarity.

Hereinafter, to allow one of ordinary skill in the art to easily carry out the invention, embodiments of the present invention will be described in detail with reference to the accompanying drawings.

Figure 2:
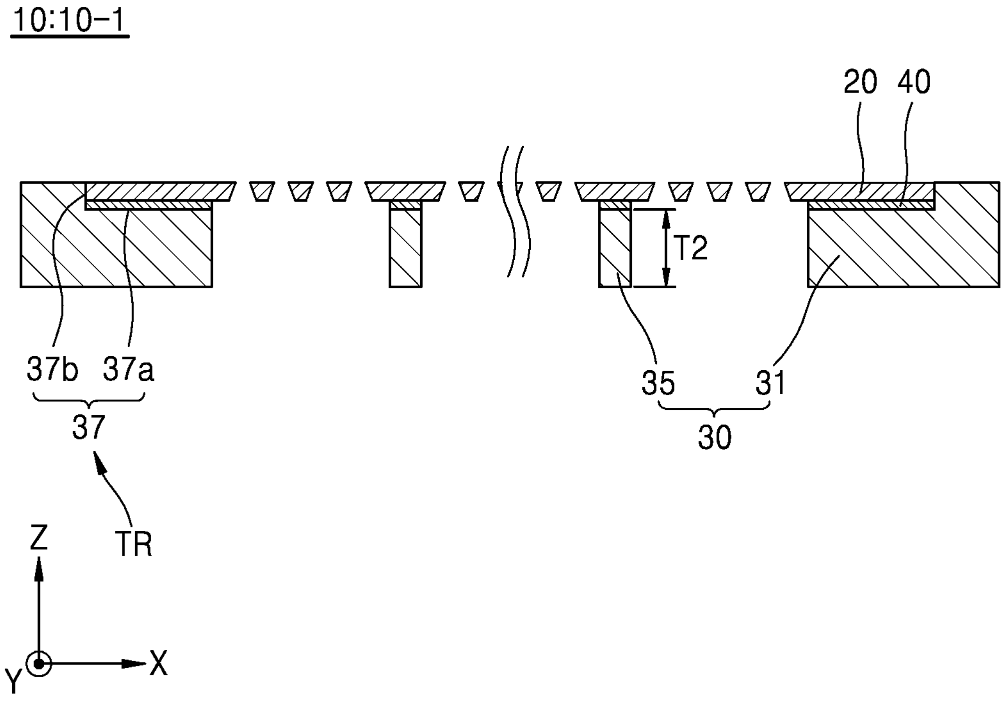
FIG. 2 is a schematic cross-sectional view taken along line A-A' of FIG. 1.
Figure 3:
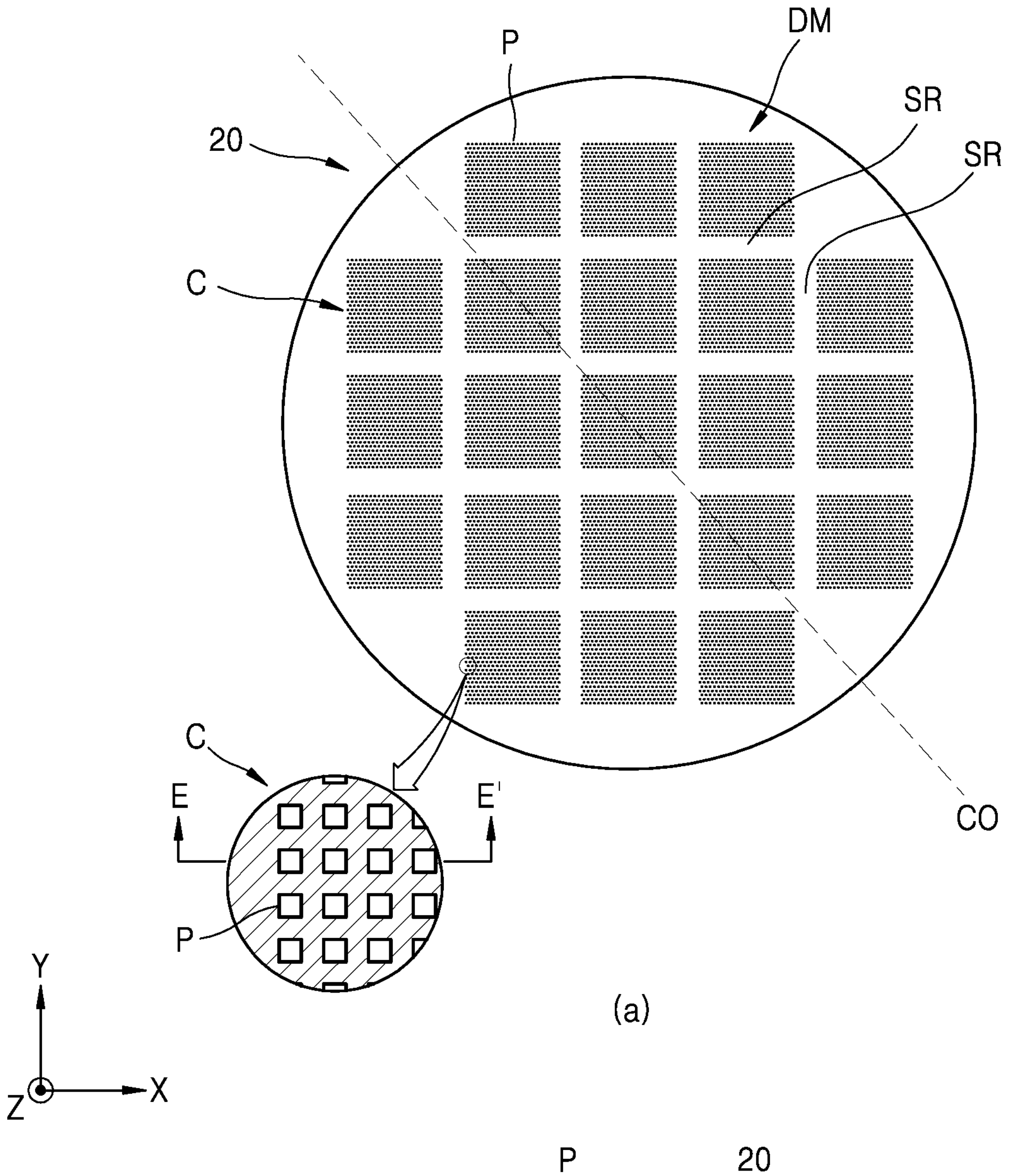
FIG. 3 illustrates a schematic plan view and a schematic cross-sectional view taken along line E-E' showing a mask according to an embodiment of the present invention.
Figure 3:
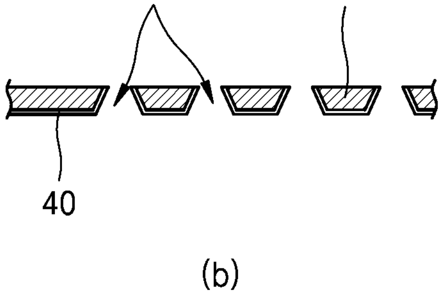
Figure 4:
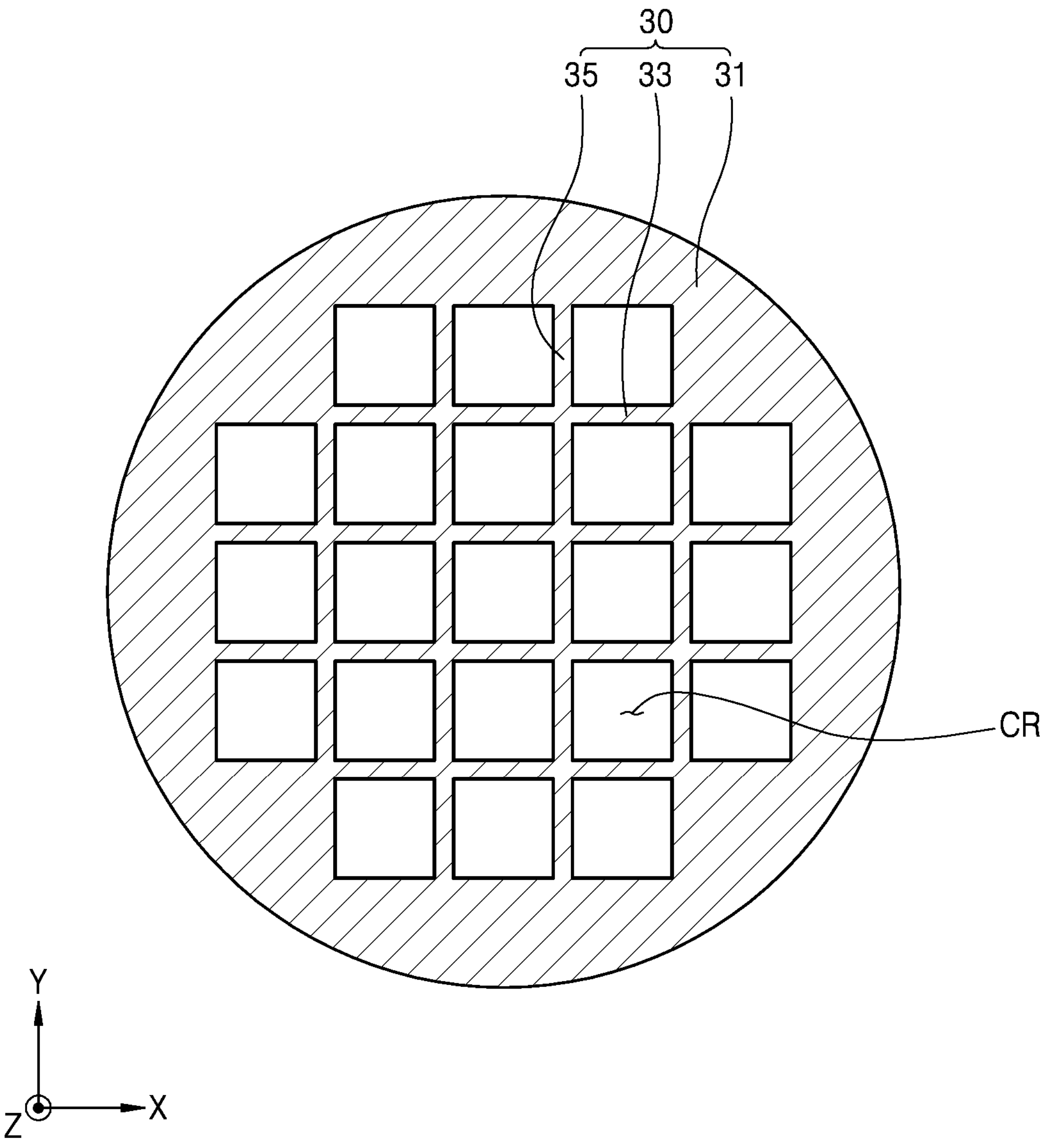
FIG. 4 is a schematic plan view showing a support according to an embodiment of the present invention.

FIG. 1 is a schematic view showing a mask-support assembly 10 according to an embodiment of the present invention. FIG. 2 is a schematic cross-sectional view taken along line A-A' of FIG. 1. FIG. 3 illustrates a schematic plan view and a schematic cross-sectional view taken along line E-E' showing a mask according to an embodiment of the present invention. FIG. 4 is a schematic plan view showing a support 30 according to an embodiment of the present invention.

A microdisplay, which is recently applied to a virtual reality (VR) device, may be used in a pixel deposition process for a target substrate 1900 (see FIG. 21), such as a silicon wafer or a silicon wafer, rather than for a substrate of a large area. The microdisplay has a screen that is about 1 to 2 inches smaller than the size of the large area substrate because a screen is positioned directly in front of an eye of a user. Moreover, implementation of higher resolution is required since the screen is positioned closely in front of the eye of the user.

Accordingly, the present invention is directed to provide a mask-support assembly 10 which, rather than being used in a pixel formation process for a target substrate of a large area with a side length exceeding 1,000 mm, allows for a pixel formation process on a semiconductor silicon target wafer 1900 of 200 mm, 300 mm, or 450 mm such that ultra-high-resolution pixels are formed, and a producing method thereof.

For example, currently, quad high definition (QHD) image quality is 500 to 600 pixels per inch (PPI), wherein a size of each pixel is about 30 to 50 μm, and a 4K ultra-high definition (UHD) or 8K UHD image quality has a resolution of up to 860 PPI or up to 1,600 PPI, which is higher than the QHD image quality. A microdisplay directly applied to a VR device or a microdisplay inserted into a VR device is aimed at realizing ultra-high resolution of approximately 2,000 PPI or higher and has a pixel size of about 5 to 10 μm. In the case of a semiconductor wafer or a silicon wafer, a finer and more precise process is possible compared to a glass substrate by utilizing technologies developed in a semiconductor process, and hence the semiconductor wafer or silicon wafer may be employed as a substrate of a high-resolution microdisplay. The present invention is characterized by a mask-support assembly 10 that allows for formation of pixels on the silicon wafer.

Figure 21:
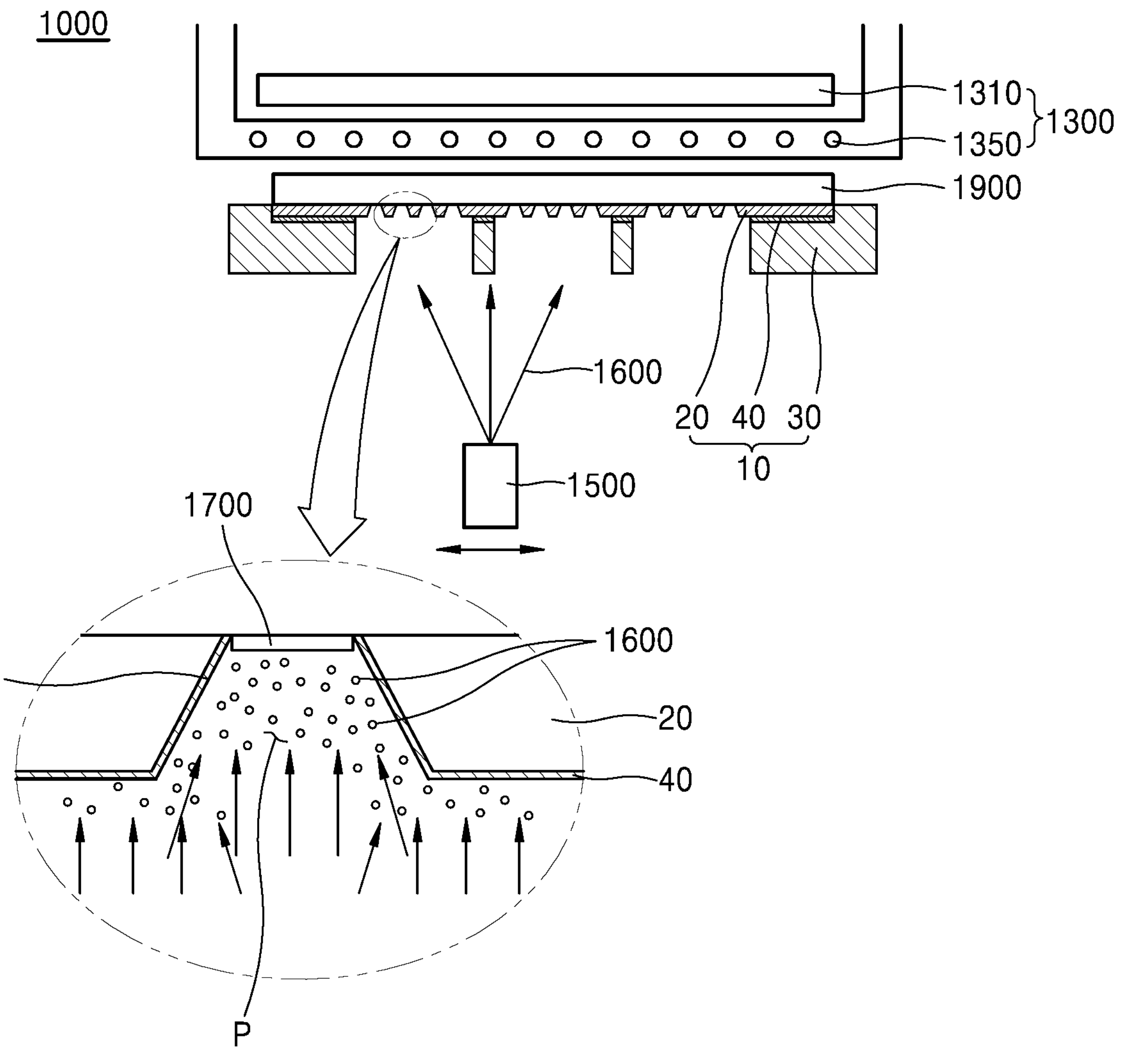
FIG. 21 is a schematic diagram illustrating an organic light emitting diode (OLED) pixel deposition apparatus to which a mask-support assembly according to an embodiment of the present invention is applied.

Referring to FIGS. 1 and 2, the present invention is characterized in that a mask 20 has a shape corresponding to a semiconductor wafer (or a silicon wafer) in order to perform a pixel deposition process using the semiconductor wafer as a target substrate 1900 (see FIG. 21). When the shape of the mask 20 corresponds to the semiconductor wafer, it means that the mask 20 has the same shape and size as those of the semiconductor wafer or that the mask 20 has a different size and shape from the semiconductor wafer but is coaxial to the semiconductor wafer while mask patterns P are disposed within the shape of the semiconductor wafer. In addition, the mask 20 that has a shape corresponding to the semiconductor wafer is characterized in that it is integrally connected to the support 30 and is thereby clearly aligned.

The mask-support assembly 10 may include the mask 20 and the support 30. The mask 20 may be connected to one surface of the support 30. The support 30 may serve as a frame that supports the mask 20.

Referring to FIGS. 1 to 3, the mask 20 may include cell portions C, separation portions SR, and a dummy portion DM. Each cell portion C is a portion of the mask 20 that does not come in contact with the support 30 and where the mask patterns P are formed, each separation portion SR is a portion disposed between the cell portions C, and the dummy portion DM is a portion attached to the support 30. Although the cell portion C, the separation portion SR, and the dummy portion DM may be denoted by different names and reference characters according to the formed positions thereof, the cell portion C, the separation portion SR, and the dummy portion DM are not separated regions and are configured to be integrally formed with the same material. In other words, the cell portion C, the separation portion SR, and the dummy portion DM are each part of the mask 20 simultaneously formed in an electroforming process. Hereinafter, the cell portion C, the separation portion SR, and the dummy portion DM may be used interchangeably with the mask 20.

The mask 20 is preferably made of an Invar or Super Invar material. Alternatively, the mask 20 may include a metal material that can be electroformed with nickel (Ni), cobalt (Co), titanium (Ti), chromium (Cr), tungsten (W), molybdenum (Mo), or combinations or alloys thereof and capable of forming silicide with a silicon component of the support 30' (or conductive substrate 30', see FIG. 5). Alternatively, the mask 20 may include a Super Invar material containing three or more components, including Co. The mask 20 may have a circular shape to correspond to the circular semiconductor wafer. The mask 20 may have a size equal to or greater than the size of a silicon wafer of 200 mm, 300 mm, 450 mm, or the like.

A conventional mask has a shape of rectangle, polygon, or the like to correspond to a substrate of a large area. In addition, a frame also has a shape of rectangle, polygon, or the like to correspond to the mask. Since the mask has angled corners, there may be a problem in that stress is concentrated on the corners of the mask. Concentration of stress may cause different force to act on only a portion of the mask, which may twist or distort the mask, leading to a failure of pixel alignment. In particular, at an ultra-high resolution of 2,000 PPI or higher, stress concentration on the corners of the mask should be avoided.

Therefore, the mask 20 of the present invention has a circular shape, and thus has no corners. That is, the dummy portion DM of the mask 20 may have a circular shape and have no corners. Since there is no corner, it is possible to solve the problem that different force acts on a specific portion of the mask 20, and the stress may be uniformly distributed along a circular edge. Accordingly, the mask 20 may contribute to clear pixel alignment without being twisted or distorted, and mask patterns P of 2,000 PPI or higher may be realized. The present invention performs a pixel deposition process by matching a circular semiconductor wafer (or a circular silicon wafer) having a low coefficient of thermal expansion and the circular mask 20 in which the stress is uniformly distributed along the edge, so that pixels with a size of approximately 5 to 10 μm may be deposited.

A plurality of mask patterns P may be formed in the cell portion C. The mask patterns P are a plurality of pixel patterns P that correspond to red (R), green (G), and blue (B) pixels. Sides of each mask pattern P may have a sloped shape, a tapered shape, or a shape in which a pattern width gradually increases from the upper part toward the lower part. A number of mask patterns P may be grouped to form a single display cell portion C. The display cell portion C may have a diagonal length of approximately 1 to 2 inches, and may be a portion that corresponds to one microdisplay. Alternatively, the display cell portion C may be a portion that corresponds to a plurality of displays.

The mask pattern P may have a substantially tapered shape, and the pattern width may be several to dozens of micrometers (μm), preferably approximately 5 to 10 μm (resolution of 2,000 PPI or higher).

The mask 20 may include a plurality of cell portions C. The plurality of cell portions C may be arranged at predetermined intervals in a first direction (x-axis direction) and in a second direction (y-axis direction) that is perpendicular to the first direction. FIG. 1 illustrates that 21 cell portions C are arranged along the first and second directions, but the present invention is not limited thereto. The separation portions SR may be disposed between the cell portions C. The cell portions C and the separation portions SR are positioned closer to the central part of the mask 20 than the dummy portion DM.

The dummy portion DM may define the outer shape of the support 30, with a circular edge or a shape corresponding to the mask 20. The dummy portion DM may be connected onto the support 30. Specifically, the dummy portion DM may be attached to at least a part of the edge portion 31 of the support 30. The dummy portion DM and the edge portion 31 may be attached to each other by forming a connection portion 40 therebetween.

Referring to FIGS. 1, 2, and 4, the support 30 may include an edge portion 31, a plurality of first grid portions 33, and a plurality of second portions 35. Although the edge portion 31 and the first and second grid portions 33 and 35 are denoted by different names and reference numerals, the cell portion C, the edge portion 31 and the first and second grid portions 33 and 35 are not separated regions and are configured to be integrally formed with the same material. Hereinafter, the edge portion 31 and the first and second grid portions 33 and 35 may be used interchangeably with the support 30.

The support 30 is preferably made of a silicon material, and more preferably, the support 30 may be formed from a silicon wafer and made of a monocrystalline silicon material. The edge portion 31 of the support 30 may have a circular shape such that the support 30 corresponds to a circular semiconductor wafer that is a target substrate 1900 (see FIG. 21). The support 30 may have a shape of the same size or at least larger than the mask 20 so that the mask 20 can be connected to an upper part of the support 30.

The edge portion 31 may define the outer shape of the support 30. The edge portion 31 may have a circular shape. However, the edge portion 31 may have a different shape as long as electroforming of the mask 20 can be easily performed and the support 30 corresponds to a semiconductor wafer, enabling an OLED pixel process.

The plurality of first grid portions 33 may extend in the first direction and connect at both ends to the edge portion 31. In addition, the plurality of second grid portions 35 may extend in the second direction, which is different from the first direction, intersecting with the first grid portions 33, and connect at both ends to the edge portion 31. For example, the first direction may be an x-axis direction, the second direction may be a y-axis direction, and the first direction and the second direction are perpendicular to each other. The first grid portions 33 are arranged in parallel to each other with predetermined intervals, and the second grid portions 35 are also arranged in parallel to each other with predetermined intervals. Also, since the first and second auxiliary grid portions 33 and 35 intersect with each other, empty spaces CR, in the form of a matrix, may appear at the intersecting portions. These empty spaces CR are referred to as "cell regions CR" (see FIG. 4) where the cell portions C of the mask 20 are disposed.

The thickness of the support 30 may be greater than the thickness of the mask 20. In order to realize mask patterns P of 2,000 PPI or higher, the thickness of the mask 20 may be formed in the range of approximately 2 μm to 12 μm. If the mask 20 is thicker than the aforementioned thickness, it may be difficult to form the mask patterns P, having an overall tapered shape, to have the width or spacing that meets the desired resolution.

The support member 30 may be formed with a thickness of approximately 50 μm to 200 μm, considering the ease of formation of the edge portion 31 and the grid portions 33 and 35, as well as factors such as rigidity to support the mask 20, reduction of shadow effects, and ease of control.

For example, the edge portion 31 and the first grid portion 33/second grid portion 35 in the support 30 may have the same thickness. By applying thickness reduction to a silicon wafer, the edge portion 31 and the first and second grid portions 33, 35 may have a thickness of approximately 50 μm to 200 μm.

In another example, the thickness of the edge portion 31 may be greater than the thickness of the first grid portion 33/the second grid portion 35 in the support 30. The edge portion 31 may serve as a frame in the mask-support assembly 10 and may be thicker than the first and second grid portions 33 and 35 in order to prevent the support 30 from deforming or warping as a whole while having sufficient rigidity to support the mask 20. For example, the thickness of the edge portion 31 may be approximately 700 μm to 1,000 μm when a silicon wafer is directly applied or approximately 500 μm to 1,000 μm when a predetermined thickness reduction is applied.

The thickness of the first and second grid portions 33 and 35 is preferably greater than that of the mask 20 but thinner than the edge portion 31. This is because the first and second grid portions 33 and 35 need to support the mask 20 while allowing the cell regions CR (see FIG. 4) therebetween, through which an organic material 1600 passes, and the thickness of the first and second grid portions 33 and 35 should not cause shadow effect when the organic material 1600 passes through. For example, the thickness of the first and second grid portions 33 and 35 may be approximately 50 μm to 200 μm.

Meanwhile, the mask-support assembly 10 of the present invention is characterized in that at least a part of the mask 20 is disposed in a recessed trench portion TR of the support 30. The trench portion TR may have a recessed trench shape with side surfaces SS on both sides (see FIG. 5), and it may also have a recessed stepped shape with only one side surface SS. FIG. 2 illustrates an example of a trench portion TR in the shape of a step 37 having a lower surface 37*a* and one side surface 37*b* in the mask-support assembly (10: 10-1). In addition, in FIG. 20(*b*), an example of a second grid portion 35 is shown, including a trench portion with side surfaces inclined similar to a taper.

From another perspective, the mask-support assembly 10 of the present invention may be understood as having the upper surface of the support 30 and the upper surface of the mask 20 on the same horizontal plane. A part of the mask 20 may be disposed in the recessed trench portion TR of the support 30, allowing the upper surfaces of the support 30 and the mask 20 to be on the same horizontal plane. In particular, referring to FIG. 2, the dummy portion DM of the mask 20 and the edge portion 31 of the support 30 may share the same upper surface.

As described above, in the mask-support assembly 10, at least a part of the mask 20 is disposed or accommodated in the trench portion TR of the support 30, thereby enhancing the anchoring effect of the trench portion TR on the mask 20. Accordingly, the alignment of the mask 20 and the alignment of the mask pattern P/cell portion C become clearer, enabling the implementation of the ultra-high resolution.

Referring back to FIG. 2, the connection portion 40 may be interposed between the mask 20 and the support 30. The connection portion 40 may be formed between the mask 20 and at least a portion of a bottom surface BS and side surfaces SS (see FIG. 5) of the trench portion TR. The mask 20 may be connected onto the support 30 with the connection portion 40 interposed between them. The edge portion 31 of the support 30 may be connected to the dummy portion DM of the mask 20, and the first and second grid portions 33 and 35 of the support 30 may be connected to the separation portions SR of the mask 20. That is, the separation portions SR may be supported on the first and second grid portions 33 and 35.

According to an embodiment, the connection portion 40 may be formed by thermal treatment H (see FIG. 8) in a state of a laminate in which the mask 20 is formed on the support 30. In this case, the connection portion 40 may be provided as an intermetallic compound resulting from the combination of the components of the mask 20 and the support 30. As the Fe and Ni components of the mask 20 and the Si component of the support 30 are combined, the connection portion 40 may be provided as a silicide containing Ni and Si, containing Fe, Ni, and Si, or containing Fe and Ni. The bonding strength of the intermetallic compound allows the mask 20 and the support 30 to be connected to each other through the connection portion 40.

In addition, according to an embodiment, the connection portion 40 may further include an adhesion layer (or auxiliary connection portion (not shown)) that mediates adhesion to allow the mask 20 to be formed with higher adhesive strength on the support 30. For example, in the case where the support 30 is a silicon wafer, the adhesive strength of the mask 20 is higher when the mask 20 of Invar or Super Invar material, is adhered to the support 30 through the auxiliary connection portion made of Ni, Cu, or the like, than when the mask 20 is directly adhered to the support 30. Taking this into account, the auxiliary connection portion may include at least one of Ni, Cu, Ti, Au, Ag, Al, Sn, In, Bi, Zn, Sb, Ge, or Cd. It is preferable to interpose a thin auxiliary connection portion to enhance the adhesion between the support 30 and the mask 20 or between the support 30 and the connection portion 40. To avoid affecting the electric field formation for electroplating the mask 20 on the support member 30, the auxiliary connection portion may be thinly formed with a thickness ranging from 0.01 μm to 0.2 μm. Within this thickness range, the electric field for electroplating may be tunneled, while providing thickness to enhance adhesion.

The connection portion 40 may be formed on the lower surface of the mask 20 or on the side surface between the mask patterns P. Alternatively, the connection portion 40, during the process of forming the edge portion 31 and the first and second grid portions 33 and 35 on the support 30, may be partially or entirely removed. For the sake of description, in FIGS. 2 and 3, the thickness of the connection portion 40 is exaggerated; however, the connection portion 40 may have a very small thickness (1 μm or less, preferably 0.1 μm or less] compared to the thickness of the mask 20 or the width of the mask pattern P, so even if the connection portion 40 is partially or entirely removed, it may have little impact on the thickness of the mask 20 or the width of the mask pattern P.

Meanwhile, the support 30 also has a circular edge similar to the mask 20 and thus has no corners, so it is possible to solve the problem that different force acts on a specific portion of the support 30. In addition, the stress may be uniformly distributed along the circular edge. Accordingly, this may contribute to preventing the support 30 from being twisted or distorted. Since the circular mask 20 is connected onto the circular support 30, there is an effect of dually distributing the stress. Furthermore, as the first and second grid portions 33 and 35 of the support 30 are disposed below the separation portions SR of the mask 20 and support the mask 20 entirely, the mask 20 having a very small thickness may be prevented from sagging at the cell portions C and the separation portions SR. As a result, the mask 20 and the support 30 may contribute to clear pixel alignment without being twisted and a resolution of 2,000 PPI or higher may be realized.

Referring back to FIG. 3, a crystal orientation (CO) of the (100) or (111) plane of the silicon wafer may not be parallel to the longitudinal directions of the grid portions 33 and 35. The grid portions 33 and 35 may extend along the x-axis direction or the y-axis direction, and the crystal orientation CO of the (100) or (111) plane of the silicon wafer of the support 30 may not be parallel to the x-/y-axis direction (at an angle of 0° or) 180° and may have a predetermined angle other than 0° or 180° with respect to the x-/y-axis direction. From another perspective, the crystal orientation CO of the (100) or (111) plane of the silicon wafer may have a predetermined angle, which is not 0° or 180°, with respect to the x-/y-axis direction in which the plurality of cell portions C are disposed. The silicon wafer is more prone to be broken in the crystal orientation CO of the (100) or (111) plane than in other crystal orientations. As the cell portions C, the separation portions SR, and the like of the mask 20 that correspond to the grid portions 33 and 35 are arranged in a staggered manner in the crystal orientation CO, the risk of breakage of the mask-support assembly 10 is reduced and overall rigidity is increased.

FIGS. 5 to 11 are schematic views showing a producing process of a mask-support assembly according to a first embodiment of the present invention. In the following, the configuration of a mask-support assembly 10-2 is described, where a mask 20 is disposed across the entire upper surface of an edge portion 31. However, it is emphasized that the producing process includes the production of the mask-support assembly 10-1 where a trench portion in the form of a step 37 is formed on the edge portion, as shown in FIG. 2, and the mask 20 is positioned above the trench portion.

Figure 5:
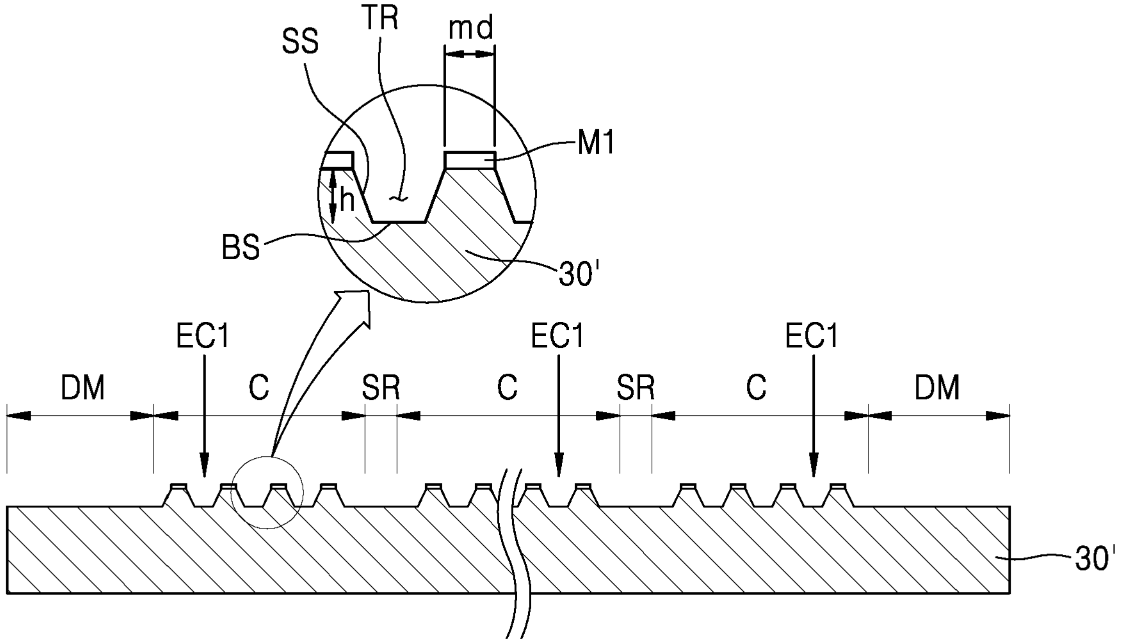
FIGS. 5 to 11 are schematic views showing a producing process of a mask-support assembly according to a first embodiment of the present invention.

Referring to FIG. 5, a support 30' is prepared. The support 30' may be a conductive substrate 30' made of a conductive material to enable electroforming. To achieve both conductivity and low resistance, the support 30' (or conductive substrate 30') may be highly doped at a concentration higher than or equal to 1019 $cm^{-3}$. The doping may be performed over the entire support 30' or limited to the surface of the support 30'. According to an embodiment, the surface resistance of the support 30' may be $5\times10^{-4}$ to $1\times10^{-2}$ ohm·cm. The support 30' may be used as a cathode electrode during electroforming.

Unlike metals with a metal oxide on the surface or polycrystalline silicon with grain boundaries, doped monocrystalline silicon, being free of defects, allows for the uniform formation of an electric field across the entire surface during an electroforming process, which results in a uniform plated film (or mask 20). The mask 20 prepared with the uniform plated film may further improve the image quality of OLED pixels. Moreover, since a process for removing or preventing defects is not additionally required, process costs may be reduced and productivity may be increased.

Then, a patterned insulating portion M1 may be formed on one surface of the conductive substrate 30' (or support 30'). The insulating portion M1 is a part formed to protrude (embossed) from one surface of the connection portion 30', and may have insulation properties to prevent the formation of a plated film (or mask 20). Accordingly, the insulating portion M1 may be made of at least one of photoresist, silicon oxides, or silicon nitrides. The insulating portion M1 may be formed by forming a silicon oxide or a silicon nitride on the support 30' using deposition or the like, and thermal oxidation or thermal nitridation methods may be used employing the support 30' as a base. A photoresist may be formed using a printing method or the like.

A width md of the insulating portion M1 may correspond to an upper width of the mask pattern P. The upper width of the mask pattern P serves as the end portion through which an organic material 1600 passes during the OLED pixel deposition process, determining the resolution of the pixel.

When aiming for ultra-high resolution of about 2,000 PPI or higher, with pixel sizes around 5 to 10 μm, the width (md) of the insulating portion M1 may be formed to be approximately 5 to 10 μm. Additionally, as described above, since a trench portion TR is formed on the support 30', the insulating portion M1 may be formed thinly within the range required to create the trench portion TR. Considering that the trench portion TR corresponds to the thickness of the mask 20 (approximately 2 to 12 μm), the insulating portion M1 may be formed to be thin, around 0.5 to 2 μm. Therefore, there are advantages in facilitating the formation of the insulating portion M1 and reducing material usage.

Then, the support 30' may be subjected to etching EC1. Etching EC1 may be performed on a first surface (or upper surface) of the support 30' exposed between patterns of the insulating portion M1. Dry etching or wet etching may be used for etching EC1. Wet etching has isotropic etching characteristics, while dry etching has isotropic etching characteristics and allows precise etching to a desired width. Alternatively, laser etching using femtosecond laser, picosecond laser, or the like may be used for precise etching. In the case of laser etching, the process of forming the insulating portion M1 may be omitted.

A recessed trench portion TR may be formed on the first surface (or upper surface) of the support 30' by etching EC1. A depth h of the trench portion TR may approximately correspond to the thickness of the mask 20 to be formed. For example, the depth h of the trench portion TR may be approximately 2 to 12 μm.

Figure 19:
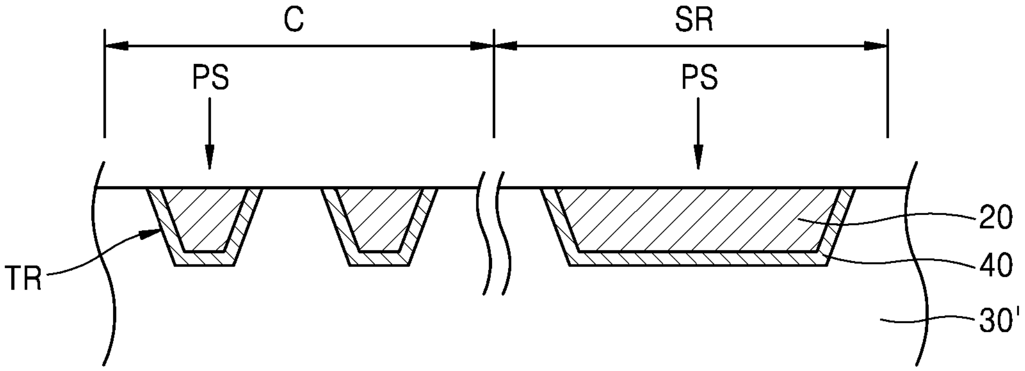
FIG. 19 illustrates schematic views showing a mask planarization process and a dummy trench portion of a grid portion according to an embodiment of the present invention.
Figure 19:
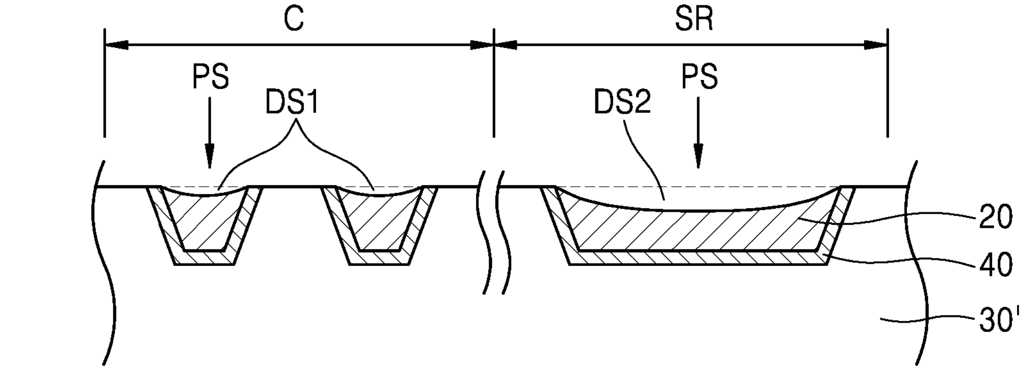
Figure 19:
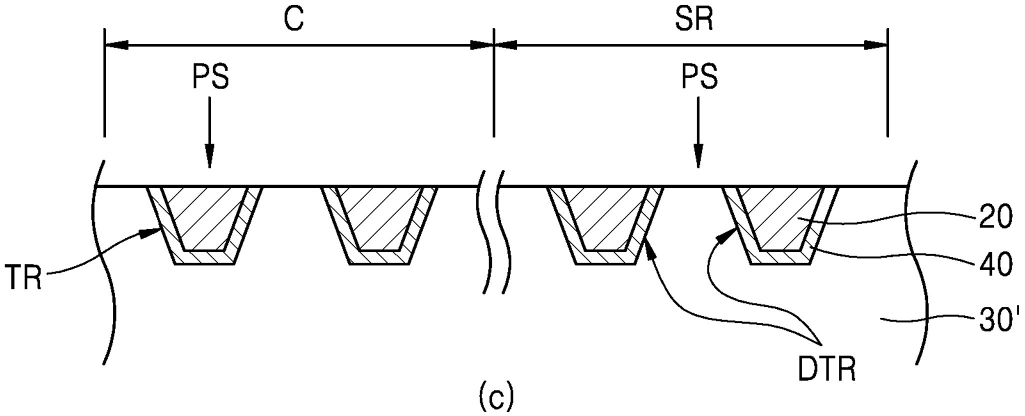
Figure 20:
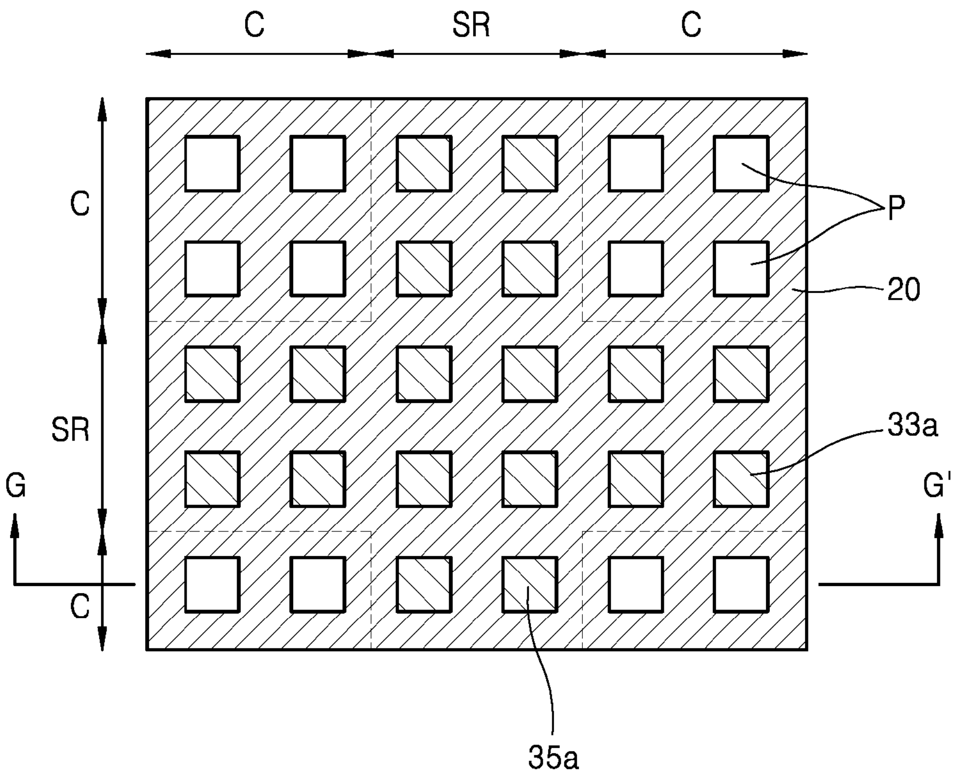
FIG. 20 illustrates a schematic plan view and a schematic cross-sectional view taken along line G-G' showing a mask pattern and a dummy trench portion of a grid portion according to an embodiment of the present invention.
Figure 20:
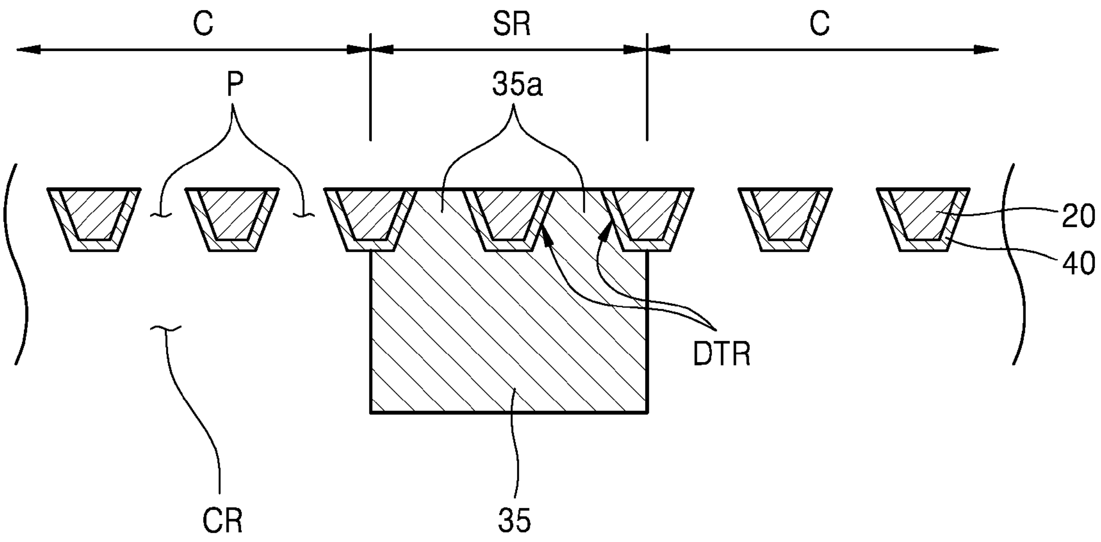

A plurality of trench portions TR may be formed by patterning. On the support 30' corresponding to the cell portion C, the trench portion TR may be formed to correspond inversely to the mask pattern P. In other words, the portion where the trench portion TR is not formed in the cell portion C may later become the mask pattern P. On the support 30' corresponding to the dummy portion DM, a trench portion in the shape of a step 37 (37*a* and 37*b*) may be formed, as shown in FIG. 2, or a trench portion with side surfaces may be formed, or no trench portion TR may be formed. On the support 30' corresponding to the separation portion SR, no trench portion TR may be formed, or a dummy trench portion DTR may be formed, as shown in FIGS. 19 and 20.

The trench portion TR may include a bottom surface BS and side surfaces SS. The side surfaces SS may be formed to be inclined either vertically or at a predetermined angle. When using wet etching EC1, which has isotropic etching characteristics, the side surfaces SS may be formed to be inclined at a predetermined angle. In other words, the side surfaces SS of the trench portion TR may be tapered. By taking into account the crystal orientation of the monocrystalline silicon material of the support 30' during etching, it is possible to implement the taper angle of the trench portion TR to correspond to the etching direction.

Figure 6:
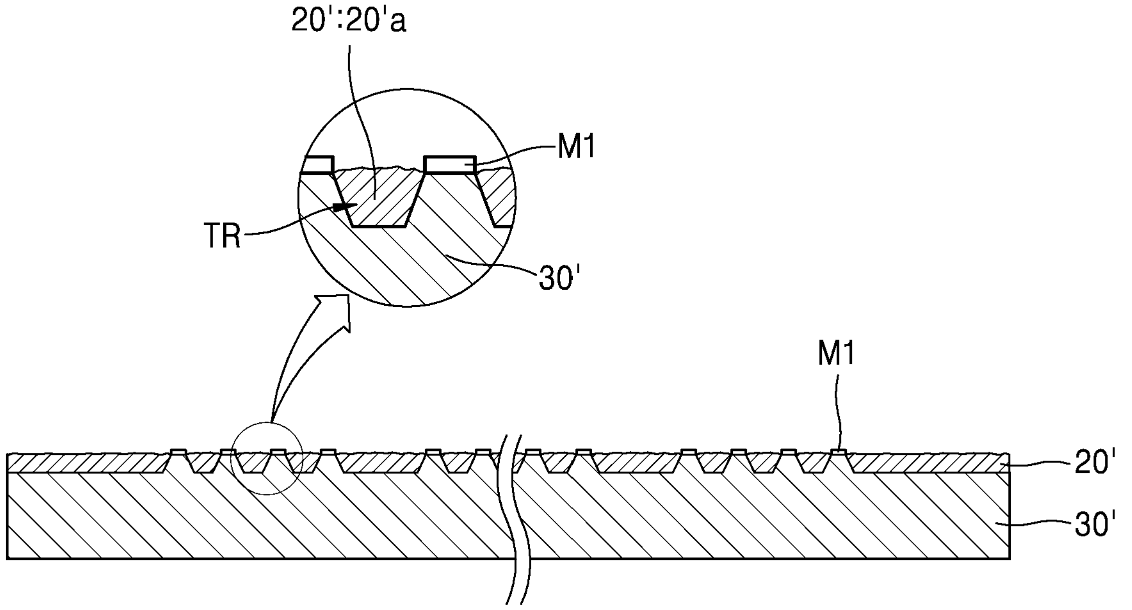

Then, referring to FIG. 6, a mask 20' (20'*a*) may be formed by performing electroforming on the support 30'. The support 30' is used as a cathode body and an anode body (not shown) facing the anode body is prepared. The anode body may be immersed in a plating solution (not shown), and the support 30' may be partially or entirely immersed in the plating solution. As the insulating portion M1 has the insulating properties, a plated film is not formed in a region that corresponds to the insulating portion M1. In particular, the plated film may be formed in the trench portion TR to create the mask 20'. The thickness of the mask 20' may be controlled to fill the trench portion TR without exceeding the height of the insulating portion M1. In other words, the electroforming may be performed in such that an upper end of the mask 20' is positioned higher than the first surface (or upper surface) of the support 30' and lower than an upper end of the insulating portion M1.

Meanwhile, the composition may be controlled to allow the mask 20' to have a coefficient of thermal expansion (CTE) similar to that of the silicon material of the support 30'. In the mask-support assembly 10, the support 30 serves as a frame of silicon material, and the mask 20 should have a CTE similar to that of the support 30 to prevent sagging on the support 30, which serves as a frame. In addition, this may minimize variations in pixel position accuracy (PPA), which represents the alignment error of cell portions C and mask patterns P on the support 30.

Taking this into account, the composition of the mask 20' may be controlled such that the CTE of the support 30 made of silicon material and the CTE of the mask 20 after heat treatment H, which will be described below, become approximately $(3.5\pm1)\times10^{-6}/°$ C. Even when the mask 20' is made of Invar material, varying the composition ratios of Fe and Ni during electroforming may enable precise control of the CTE to closely match that of the support 30' made of silicon material. Alternatively, the CTE of the mask 20' may be controlled to be smaller or greater than that of the support 30' so that the mask metal film 20' can be tightly connected onto the support 30' depending on process temperature conditions.

Also, the mask 20' formed by electroforming needs to be well adhered to the support 30' without peeling off during the subsequent processes, such as heat treatment H, etching EC2, and the like, which will be described below. To this end, various approaches may be considered.

In one approach, a native oxide of the support 30' on which electroforming is to be performed may be controlled. An oxide may be formed on the surface of the support 30' made of a silicon wafer material. On the surface with such an oxide, a uniform electric field may not be generated, and hence the plated film (mask 20') may not be uniformly produced, and the adhesion between the produced plated film (mask 20') and the support 30' may be low. Therefore, a process of removing native oxide is preferably followed by an electroforming process.

In another approach, another film may be further formed to mediate adhesion between the plated film (mask 20') and the support 30'. In addition to a barrier film, which will be described below, a film or a combination of films providing adhesion to both surfaces of the film may be used.

In still another approach, the surface of the support 30' may be pre-treated before electroforming. Through physical treatment or chemical treatment, the plated film (mask 20') produced in the electroforming process may be formed on the support 30' with stronger adhesion. In addition, by controlling the plating method in the electroforming process, the plated film (mask 20') may be formed on the support 30' with stronger adhesion.

Figure 7:
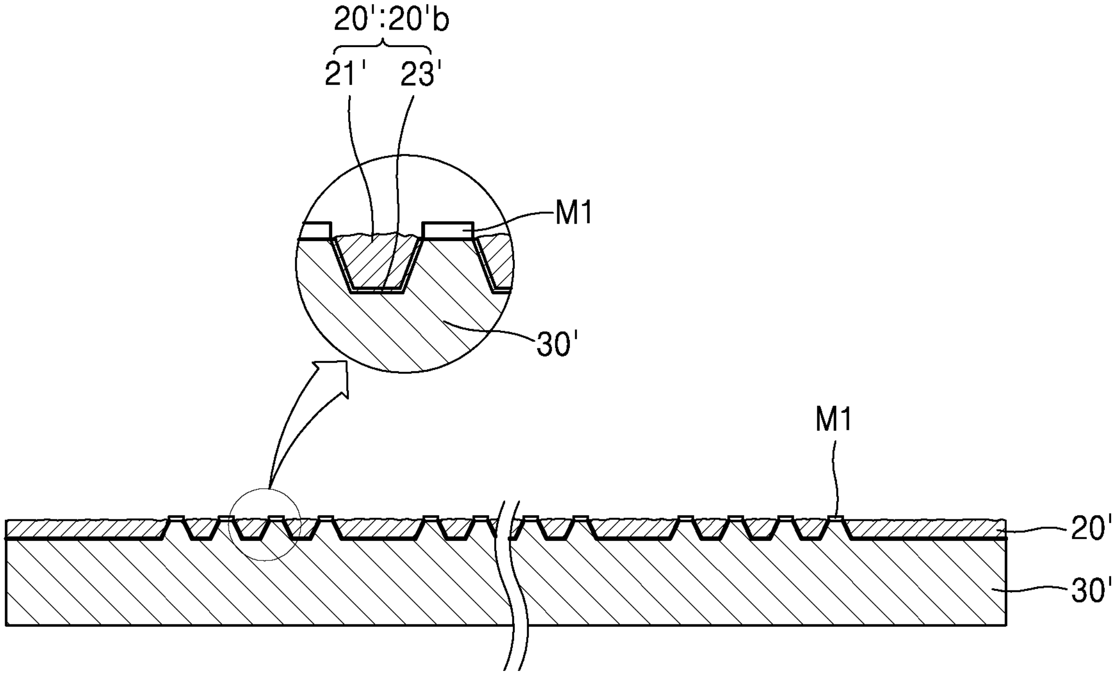

Meanwhile, referring to FIG. 7, the mask 20' (20'*b*) may be configured as a laminate with two or more plated layers such that the mask 20' has a CTE similar to that of the silicon material of the support 30'. In this case, a first mask layer 23' may be formed of a metal material capable of forming silicide with the support 30'. The first mask layer 23' may be formed of a material, such as Ni, Co, Ti, Cr, W, Mo, or the like, which exhibits high adhesion to the support 30', when produced by electroforming. A second mask layer 21' may be made of a material, such as Invar, Super Invar, or the like, which exhibits a low CTE, when produced by electroforming. As the first and second mask layers have different CTEs, the CTE of the mask 20' may be controlled by adjusting the thickness ratio of the first and second mask layers. The thickness ratio of the first and second mask layers may be controlled by adjusting the electroforming duration.

Additionally, by adjusting the current density during electroforming, the mask 20' (20'*b*) may be composed of two or more layers with different compositions. For instance, the mask 20'*b* may include a first mask layer 23', which is either a pure Ni layer or an alloy layer rich in Ni, and a second mask layer 21', which is an Invar alloy layer. First, by applying a first current density, the first mask layer 23', which is a pure Ni layer or an alloy layer with Ni content greater than 60 wt %., may be formed on at least a portion of the bottom surface BS and side surfaces SS of the trench portion TR. Subsequently, by applying a second current density different from the first current density, the second mask layer 21', which is a Fe—Ni alloy layer (Invar layer) with Ni content of 36 wt % to 42 wt % may be formed on the first mask layer 23'. The second current density may be a value less than the first current density. For example, when the first current density is applied in an electroforming solution environment capable of forming Fe—Ni alloy, a Ni-rich layer may be plated, and changing to the second current density may result in a layer with an increased proportion of Fe.

However, the first mask layer 23' needs to have a thinner thickness than the second mask layer 21'. In order to match the low CTE of the second mask layer 21', it is preferable to form the first mask layer 23' only to the extent necessary to ensure adhesion to the support 30'. Taking this into consideration, the thickness of the first mask layer 23' is preferably 2% to 20% of the thickness of the second mask layer 21'.

The Ni in the first mask layer 23' is advantageous for forming silicide through heat treatment at relatively low temperatures compared to Invar. Additionally, since the adhesion between Ni in the first mask layer 23' and Invar is good, the first mask layer 23' may mediate adhesion between the support 30' of silicon material and the second mask layer 21'. Utilizing a Ni-rich first mask layer 23' allows the formation of the connection portion 40 through heat treatment H (see FIG. 8) at temperatures below 400° C.

For another example, the mask 20'*b* may be configured with pure Ni layers or Ni-rich alloy layers included in the lower and upper layers, while incorporating an Invar alloy layer as an intermediate layer. In this case, during the electroforming process, an alloy layer with pure Ni or Ni content greater than 60 wt % may be formed as a lower layer (the first mask layer) on at least a portion of the bottom surface BS and side surfaces SS of the trench portion TR by applying the first current density. Subsequently, by applying the second current density different from the first current density, an Fe—Ni alloy layer (Invar layer) with Ni content of 36 wt % to 42 wt % may be formed as an intermediate layer (the second mask layer). Then, by applying a third current density that is different from the second current density (or the first current density), an alloy layer with pure Ni or Ni content greater than 60 wt % may be formed as an upper layer (third mask layer). The second current density may be less than the first current density (or the third current density). The thickness of the third mask layer may correspond to the thickness of the first mask layer.

In this case, the upper layer, which is an alloy layer with pure Ni or Ni content greater than 60 wt %, contains more Ni than the Fe—Ni alloy layer (Invar layer) containing Fe, and thus can reduce the degree of oxidation during the subsequent heat treatment H process. Additionally, there is an advantage in protecting the intermediate layer as the upper layer is removed first during the subsequent planarization PS process."

Meanwhile, before electroforming of the mask 20' (20'*a* and 20'*b*) shown in FIGS. 6 and 7, an auxiliary connection portion (not shown) may be further formed on at least a portion of the trench portion TR. For example, when the support 30 is a silicon wafer, the adhesion is higher when the mask 20, made of materials such as Invar or Super Invar, is adhered to the support 30 through the auxiliary connection portion made of Ni, Cu, or the like, compared to direct adhesion of the mask 20 to the support 30. Taking this into account, the auxiliary connection portion may include at least one of Ni, Cu, Ti, Au, Ag, Al, Sn, In, Bi, Zn, Sb, Ge, or Cd. If the material of the auxiliary connection portion makes electroforming difficult, it may be formed using methods such as sputtering or brazing. The auxiliary connection portion may be formed of materials such as Ni, Cu, Ti, Au, Ag, and Al that exhibit high adhesion to the support 30' when produced through electroforming. Alternatively, when formed by sputtering or brazing, the auxiliary connection portion may be composed of materials such as Sn, In, Bi, Zn, Sb, Ge, Cd, or the like that exhibit high adhesion to the support (30'). The auxiliary connection portion may be thinly formed to have a thickness of 0.01 μm to 0.2 μm.

Figure 8:
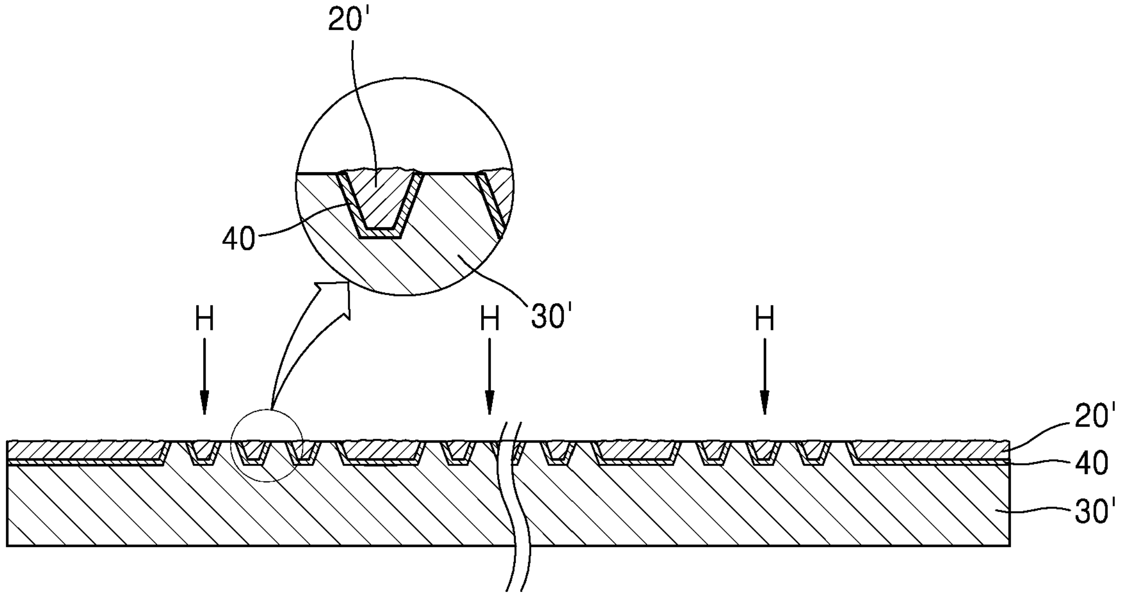

Then, referring to FIG. 8, heat treatment H may be performed on the mask 20' and the support 30'. A process of removing the insulating portion M1 may be performed before and/or after heat treatment H. The heat treatment may be performed at a temperature of 100° C. to 800° C. For example, when the mask 20' is directly formed on the support 30', as shown in FIG. 6, heat treatment may be carried out at temperatures ranging from 300° C. to 800° C. For another example, when the first mask layer 23' is formed between the second mask layer 21' and the support 30', as shown in FIG. 7, heat treatment H may be performed at temperatures ranging from approximately 100° C. to 800° C., preferably in the low-temperature range of approximately 100° C. to 400° C. During the heat treatment (H) process, a predetermined pressure may be applied to perform the heat treatment with less heat.

Generally, compared to an Invar thin plate produced by rolling, the Invar thin plate produced by electroforming has a higher CTE. Therefore, performing heat treatment on the Invar thin plate may reduce the CTE. However, there may be slight deformation in the Invar thin plate during this heat treatment process. If heat treatment is performed only on the mask 20 that exists separately, slight deformation may occur in the mask patterns P. Therefore, when heat treatment is performed in a state where the support 30' and the mask 20 are adhered to each other, subtle deformations of the mask patterns P caused by the heat treatment may be prevented.

In addition, the present invention involves the form in which the mask 20' is precisely accommodated in the trench portion TR. When heat treatment H is performed in this state, a unique effect occurs where the side surfaces SS and the bottom surface BS of the trench portion TR can prevent the mask 20' from deforming in the horizontal direction. Also, the present invention provides a larger contact area between the support 30' and the mask 20' since the mask 20' is accommodated in the trench portion TR, making it advantageous for the formation of the connecting portion 40 through heat treatment H.

On the other hand, the Invar thin plate, produced by electroforming, and the silicon wafer have almost the same CTEs, approximately 3 to 4 ppi. Thus, even with the heat treatment H, the mask 20' and the support 30' have the same or similar degree of thermal expansion, preventing misalignment due to thermal expansion and avoiding subtle deformations in the mask pattern P.

Moreover, the present invention is characterized by the connection of the mask 20' and the support 30' through the heat treatment H. During the heat treatment H process, the connection portion 40 may be formed between the mask 20' and the support 30'. The connection portion 40 may be provided as an intermetallic compound resulting from the combination of the components of the mask 20' and the support 30'. As the Fe and Ni components of the mask 20 and the Si component of the support 30' are combined, the connection portion 40 may be provided as a silicide containing Ni and Si, containing Fe, Ni, and Si, or containing Fe, Ni and other components. The bonding strength of the intermetallic compound allows the mask 20' and the support 30 to be attached to each other through the connection portion 40.

Additionally, according to an embodiment, the heat treatment H process may be carried out in multiple steps. As a 2-step heat treatment, $Ni_2Si$ may be formed in the low-temperature range (approximately 250° C. to 350° C.), adhering the mask 20 to the support 30', followed by gradually raising the temperature to the high-temperature range (approximately 450° C. to 650° C.) to perform the heat treatment. In the case of an Invar mask produced by electroforming, due to its microcrystalline and/or amorphous structure, a rapid increase in temperature during heat treatment may lead to the detachment or separation of the Invar mask from the silicon wafer support 30' due to volume contraction. Therefore, it is preferable to perform heat treatment by gradually raising the temperature to high temperature after attaching the Invar mask to the silicon wafer support 30' at low temperature.

In addition, according to an embodiment, a reducing atmosphere should be maintained during the heat treatment H. The reducing atmosphere may be formed as $H_2$, Ar, or $N_2$ atmosphere, and may preferably use a dry $N_2$ gas to prevent oxidation of the Invar mask. In order to prevent oxidation of the Invar mask, it is necessary to manage the $O_2$ concentration to be less than 100 ppm. Alternatively, a vacuum atmosphere of $<10^{-2}$ torr may be formed. The duration may range from 30 minutes to 2 hours.

With the formation of the connection portion 40 (adhesive layer) such as Ni silicide, (Ni, Fe) Si silicide, etc., on the interface of the electroformed mask 20' on the silicon wafer support 30', the mask 20' and the support 30' may be connected to each other with the connection portion 40 interposed therebetween.

Meanwhile, to control the reaction of Ni and Fe—Ni with Si during the heat treatment H, a barrier film (not shown) may be formed on the support 30' before electroforming the mask 20' on the support 30'. The barrier film may prevent the components (e.g., Ni and Fe—Ni) of the mask 20' from permeating uncontrollably into the silicon support 30'. Also, the barrier film preferably has conductivity to allow electroforming to take place on the surface. Taking this into account, the barrier film may include a material, such as titanium nitride (TiN), titanium/titanium nitride (Ti/TiN), tungsten carbide (WC), titanium tungsten (WTi), graphene, or the like. A thin film formation process such as deposition of barrier film may be used without limitations. The barrier film may control the reaction of Fe and Ni with Si to ensure the formation of a uniform silicide and allow the mask 20' and the connection portion 40 to be attached to each other with appropriate adherence strength. In addition, the barrier film may be configured as a film or a combination of films capable of providing predetermined adhesion or adherence so that the mask 20' is not separated from the support 30' in a state in which the mask 20' is electroformed on the support 30'.

The thickness of the connection portion 40 (silicide thickness) may be controlled to 10 to 300 nm by adjusting temperature and time, facilitating the connection between the support 30' and the mask 20'.

On the other hand, when the above-described auxiliary connection portion is further interposed, a phase change occurs where the auxiliary connection portion between the mask 20' and the support 30' is melted by the heat treatment and then solidifies again during the heat treatment H process. Through this phase change, the auxiliary connection portion may mediate the connection between the mask 20' and the support 30'. The auxiliary connection portion may act as an adhesion layer or a glue layer. From another perspective, the connection may be achieved by altering the interfacial state between the mask 20', the support 30', and the auxiliary connection portion in a manner that metal components of the auxiliary connection portion diffuse into the mask 20' and the support 30', or conversely, the components of the mask 20' and the support 30' diffuse into the auxiliary connection portion, or in a manner that the components of the mask 20', the support 30', and the auxiliary connection portion diffuse mutually into each other.

Alternatively, the heat treatment process may be omitted, considering the connection strength between the mask 20' and the support 30'.

Figure 9:
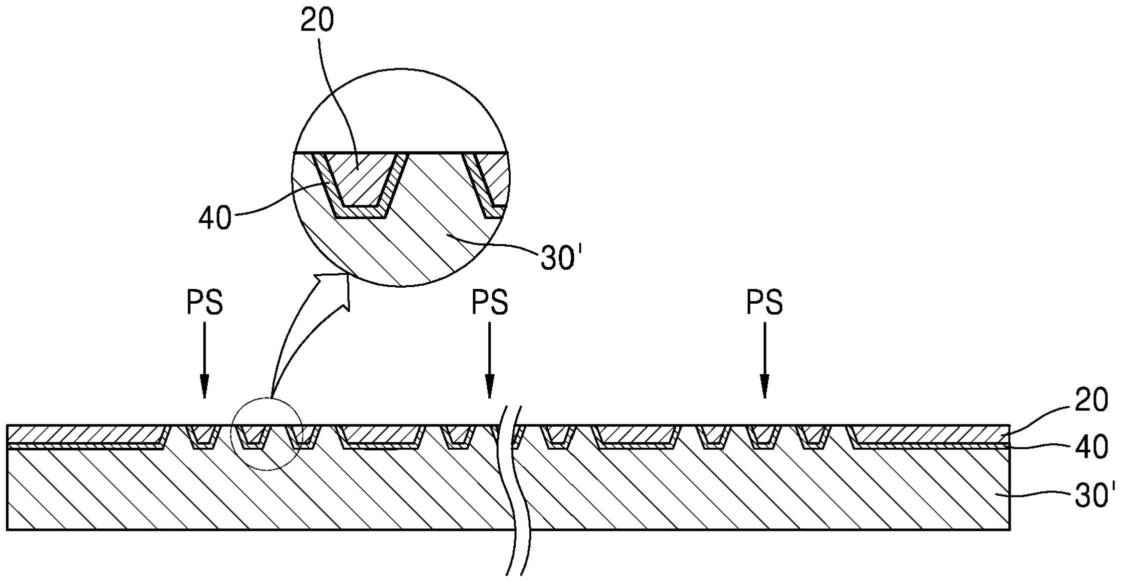

Then, referring to FIG. 9, planarization PS may be performed on the mask 20'. Here, planarization PS refers to flattening one surface (upper surface) of the mask 20' while simultaneously partially removing the upper part of the mask 20' to reduce the thickness (20'→20). Planarization PS can be performed using methods such as lapping, polishing, buffing, etc.

After planarization PS, the mask 20 and the support 30' may share at least the same upper surface. As the planarization PS is performed while the mask 20 is accommodated in the trench portion TR of the support 30, the mask 20 can share the same upper surface with the support 30'.

On the other hand, the heat treatment H of FIG. 8 and the planarization PS of FIG. 9 may also be applied in the reverse order. Planarization PS may be first performed on the mask 20' to reduce the thickness (20'→20), and then, through the heat treatment H, the connection portion 40 may be formed.

Figure 10:
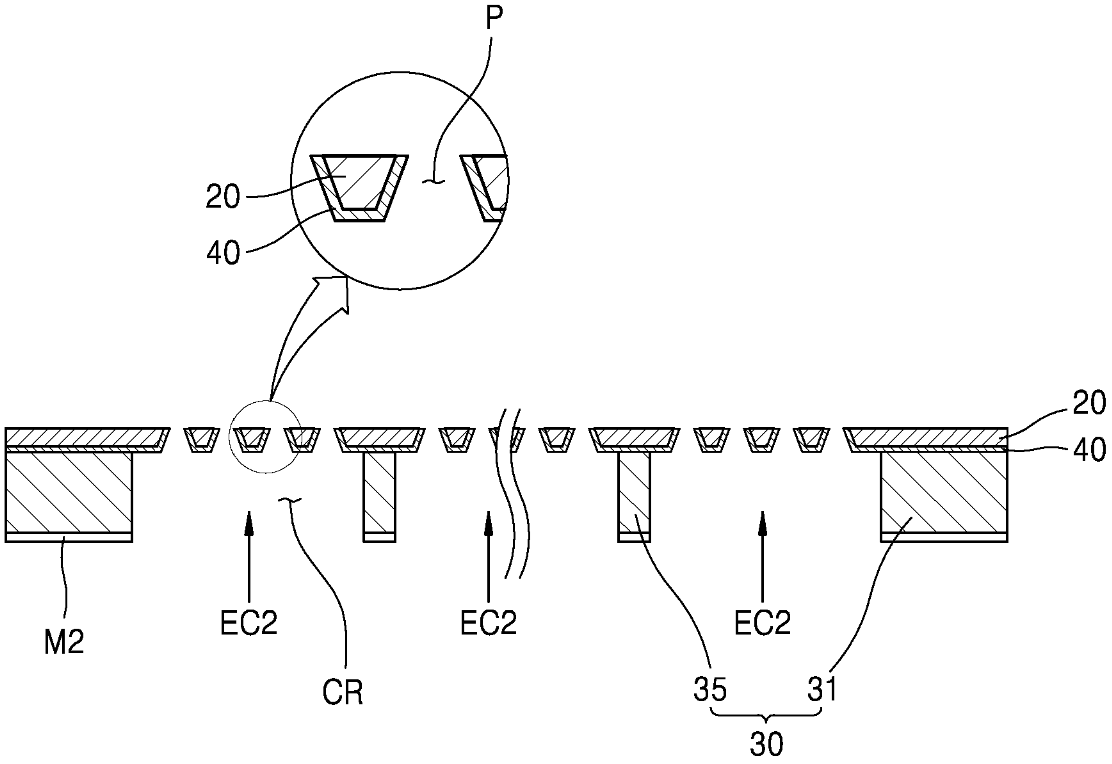

Then, referring to FIG. 10, the support 30' may be subjected to etching EC. Etching EC may be performed on a second surface (lower surface) opposite to the first surface (upper surface) of the support 30' to which the mask 20 is connected. Etching EC2 may be performed on a region of the support 30' corresponding to the cell portion C of the mask 20. A region that corresponds to the separation portion SR of the mask 20 is not subjected to etching. Optionally, before etching EC2 of the support 30', a thickness reduction process may be performed on the entire lower surface (second surface) or the central part of the support 30'.

The support 30 after etching EC2 may take a form including the edge portion 31 and the first and second grid portions 33 and 35. To ensure clear visibility of the edge portion 31 and the first and second grid portions 33 and 35 on the support 30, it is preferable to use a dry etching method with anisotropic etching characteristics. Since the support 30' is a silicon wafer, there is an advantage in that etching EC2 can be performed by utilizing existing semiconductor-related technologies and Micro-Electro Mechanical System (MEMS)-related technologies.

In order to impart etch resistance, an insulating portion M2 may be formed on the lower surface of the support 30' excluding the portions corresponding to the cell portions C. The insulating portion M2 may be formed of photoresist using a printing method or the like, and may be formed of silicon oxide or silicon nitride serving as a hard mask by a method such as thermal oxidation or thermal nitridation. Meanwhile, a metal may be used as a mask for etching. The exposed portion of the lower surface of the support 30', not covered by the insulating layer M2, may be subjected to etching EC2.

Additionally, the present invention has the effect of providing the connection portion 40 formed between the support 30' and the mask 20 as a stopper during the etching EC2 process. As the etching EC2 progresses from the second surface of the support 30' toward the first surface, when it reaches the connection portion 40, the etching EC2 may not proceed any further. Consequently, damage to the mask 20 or mask pattern P may be prevented during the etching EC2 process.

The trench portion TR accommodates the mask 20, allowing the mask 20 to maintain its shape during the etching EC2 process. The portions between neighboring trench portions TR on the support 30' are removed after the etching EC2 process. This vacant space may be provided as the mask pattern P of the mask 20. If the side surface SS of the trench portion TR has an inclined or tapered shape, the side surface of the mask pattern P may also have the corresponding inclined or tapered shape.

Figure 11:
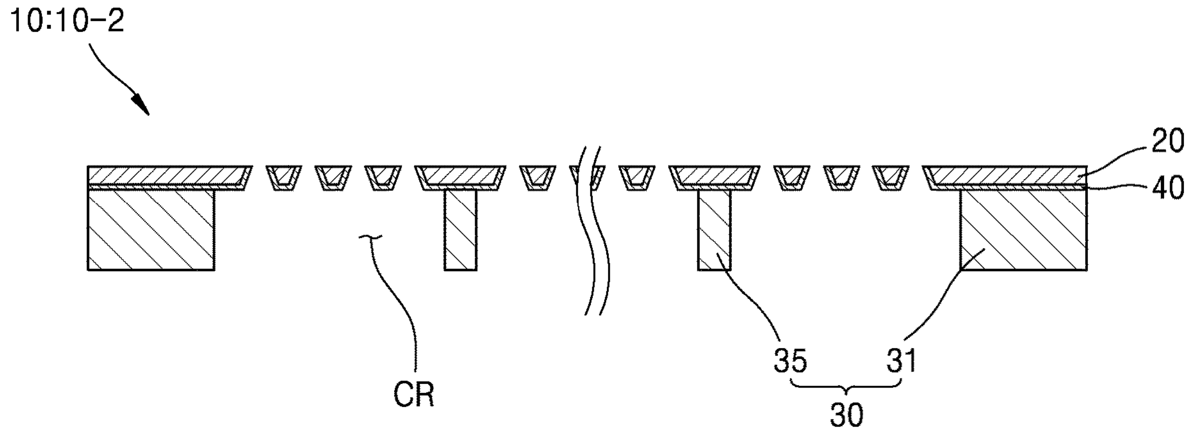

Then, referring to FIG. 11, the insulating portion M2 is removed, and subsequent processes such as cleaning may be performed to complete the producing of the mask-support assembly 10 (10-2). The form in which the support 30 includes the edge portion 31 and the first and second grid portions 33 and 35 and the mask 20 is connected onto the support 30 through the connection portion 40 may be provided. The cell portion C of the mask 20 may be provided as an area with an open lower part without support from the support 30, providing the movement path of organic material sources 1600 (see FIG. 21) during the OLED pixel deposition process.

FIGS. 12 to 16 are schematic views showing a producing process of a mask-support assembly 10 according to a second embodiment of the present invention.

First, as similar to FIG. 5, a support 30' may be prepared, and a pattered insulating portion M1 may be formed on one surface of the support 30'. Then, the support 30' is subjected to etching EC1 to form a plurality of recessed trench portions TR on the first surface (or upper surface).

Figure 12:
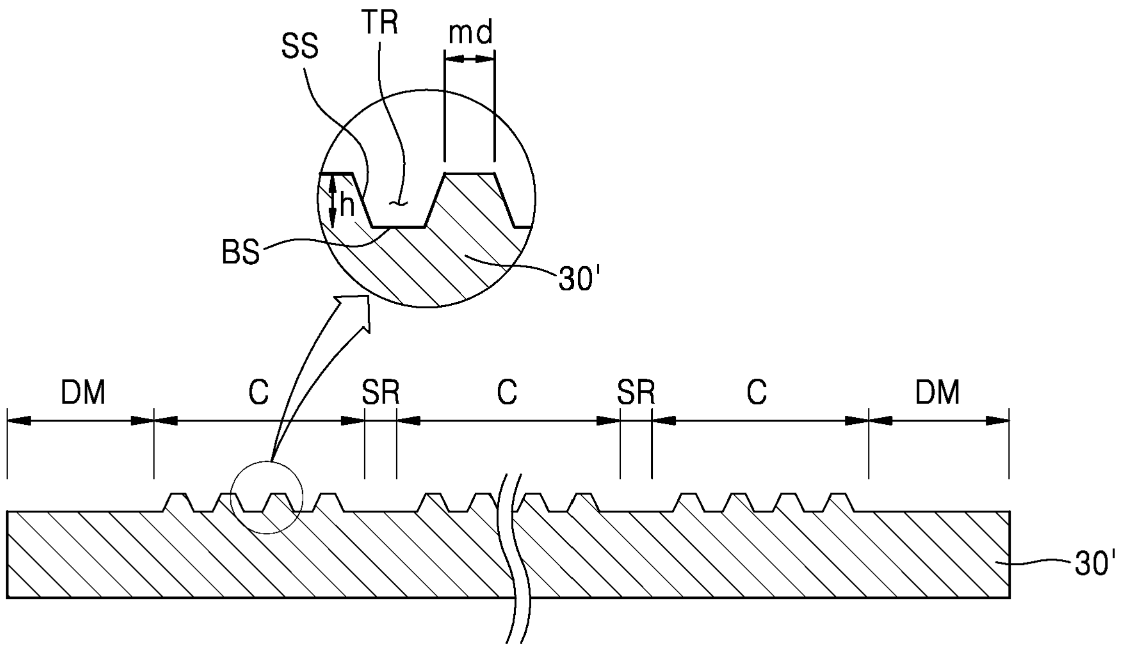
FIGS. 12 to 16 are schematic views showing a producing process of a mask-support assembly according to a second embodiment of the present invention.

Then, referring to FIG. 12, the insulating portion M1 may be removed and cleaning may be performed. In addition, pre-treatment processes for electroforming may be carried out. The plurality of trench portions TR have been formed on the support 30'.

Figure 13:
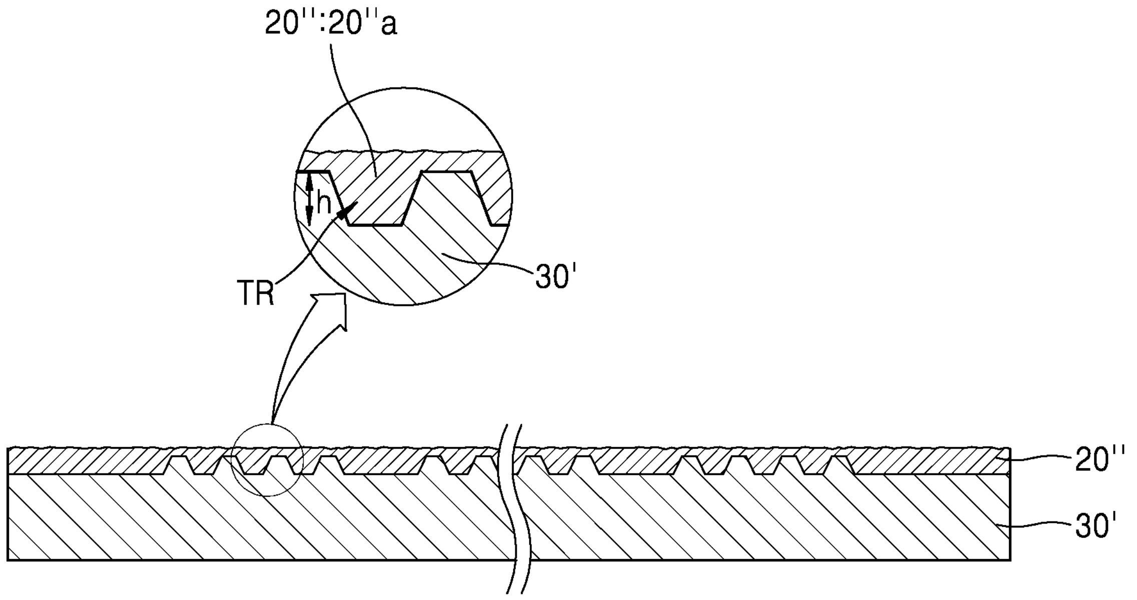

Then, referring to FIG. 13, a mask 20" may be formed by performing electroforming on the support 30'. The thickness of the mask 20" may be formed to fill the trench portion TR and cover other portions of the support 30', other than the trench portion TR. In other words, the electroforming may be performed such that the upper end of the mask 20" is positioned higher than the height of the first surface (or top surface) of the support 30'. The mask 20" (20"*a*) may be formed using the same electroforming method as described above in FIG. 6.

Figure 14:
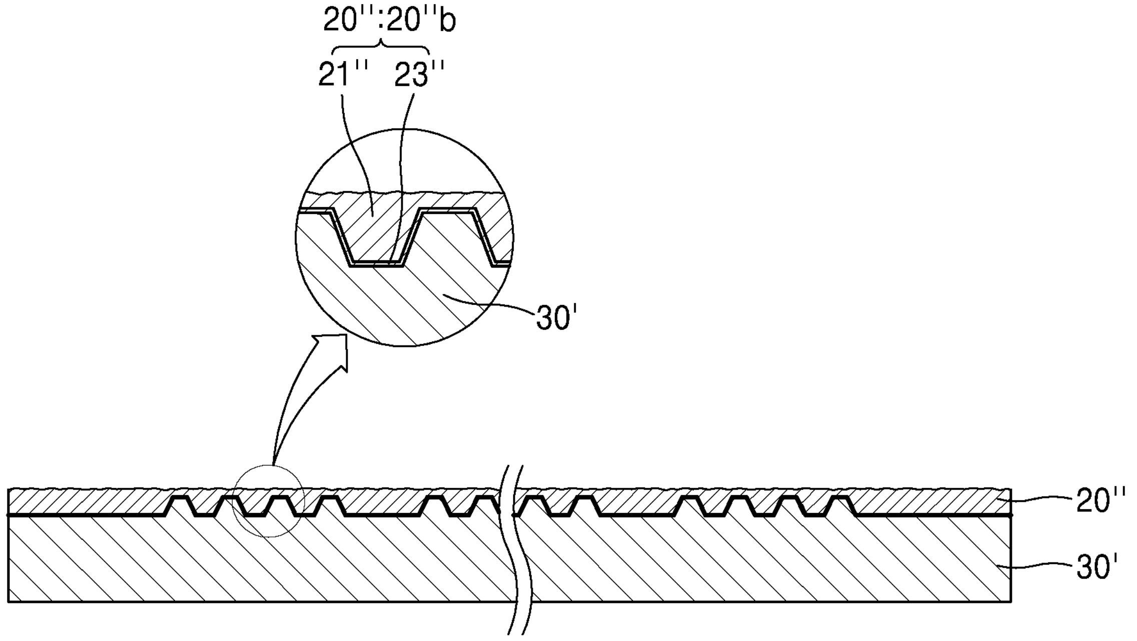

For another example, referring to FIG. 14, a mask 20" (20"*b*) may be configured as a laminate of two or more plated layers 21" and 23" by using the method of forming the first mask layer 23' and the second mask layer 21' described above in FIG. 7.

Figure 15:
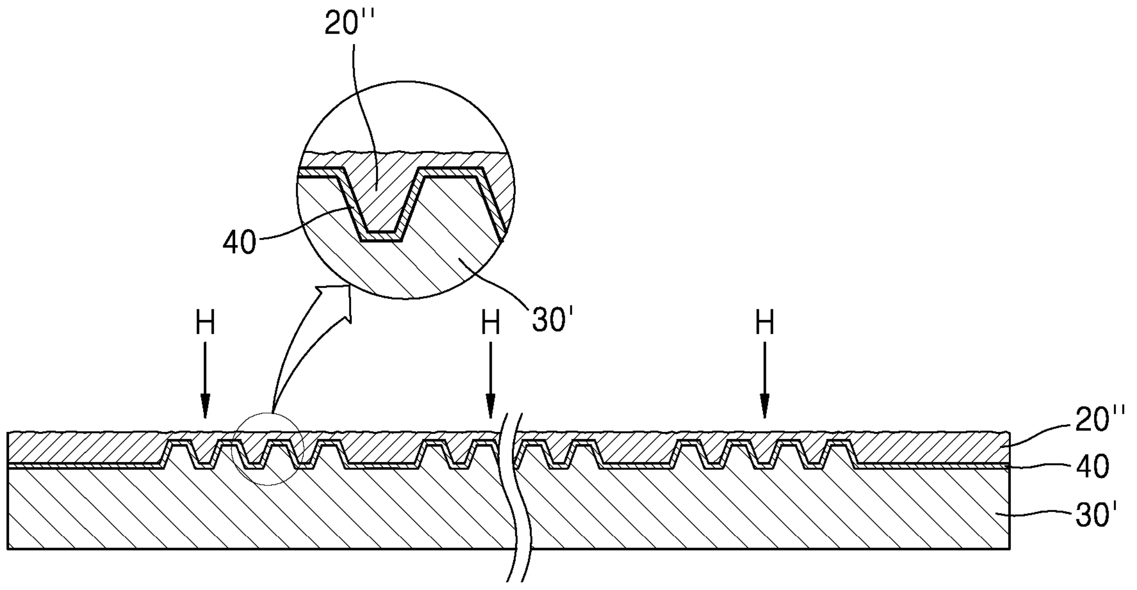

Then, referring to FIG. 15, heat treatment H may be performed on the mask 20" and the support 30'. A process of removing an insulating portion M1 may be performed before and/or after heat treatment H. The heat treatment H method described above in FIG. 8 may be equally applied. During the heat treatment H process, a connection portion 40 may be formed between the mask 20" and the support 30'. The connection portion 40 may be provided as an intermetallic compound resulting from the combination of the components of the mask 20" and the support 30'.

As the mask 20" is precisely accommodated in the recessed trench portion TR of the support 30', the mask 20" may be prevented from deforming in the horizontal direction during the heat treatment H process. This ensures a larger contact area between the support 30' and the mask 20", providing advantages for the formation of the connecting portion 40.

Figure 16:
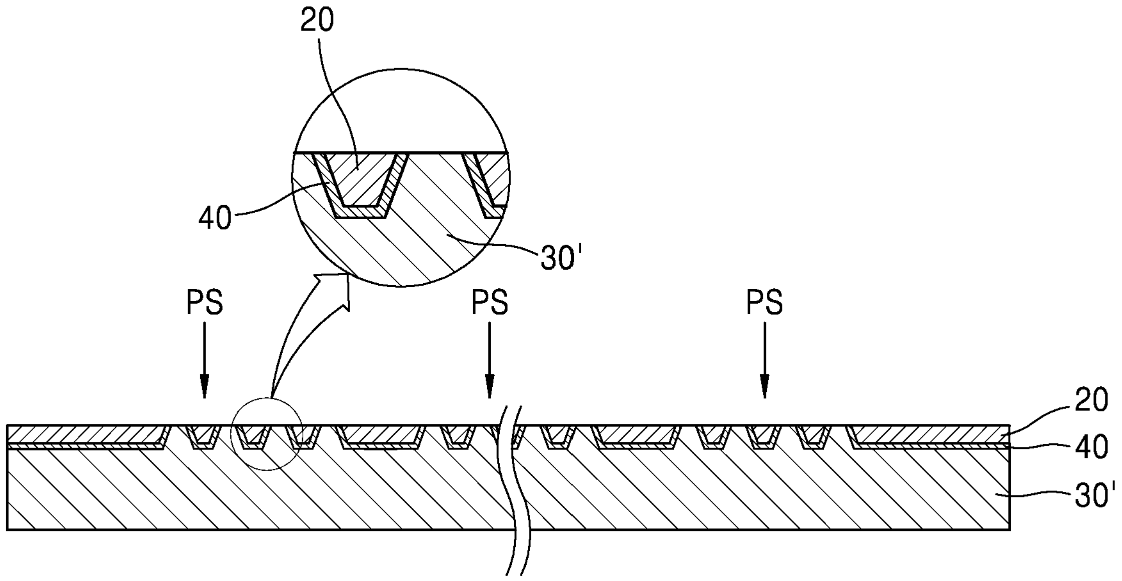

Then, referring to FIG. 16, planarization PS may be performed on the mask 20". By flattening one surface (upper surface) of the mask 20" while partially removing the upper part, the thickness may be reduced (20'→20). The portion of the mask 20" positioned higher than the height of the upper surface of the support 30' may be removed.

After planarization PS, the mask 20 and the support 30' may share at least the same upper surface. Planarization PS is performed on the upper part of the mask 20, allowing the mask 20 to share the same upper surface with the support 30' while being accommodated in the trench portion TR of the support 30'.

On the other hand, the heat treatment H in FIG. 15 and the planarization PS in FIG. 16 may be applied in the reverse order. Planarization PS may be first performed on the mask 20' to reduce its thickness (20'→20), and then, through the heat treatment H, the connection portion 40 may be formed.

As described above, a frame is formed by processing the support 30 in a state in which a separate physical tension is not applied to the mask 20 after forming the mask 20 through electroforming. Thus, there is no risk of misalignment of the mask. Accordingly, the mask is clearly aligned so that stability of pixel deposition can be improved and at the same time an ultra-high resolution of 2,000 PPI or higher can be realized.

Figure 17:
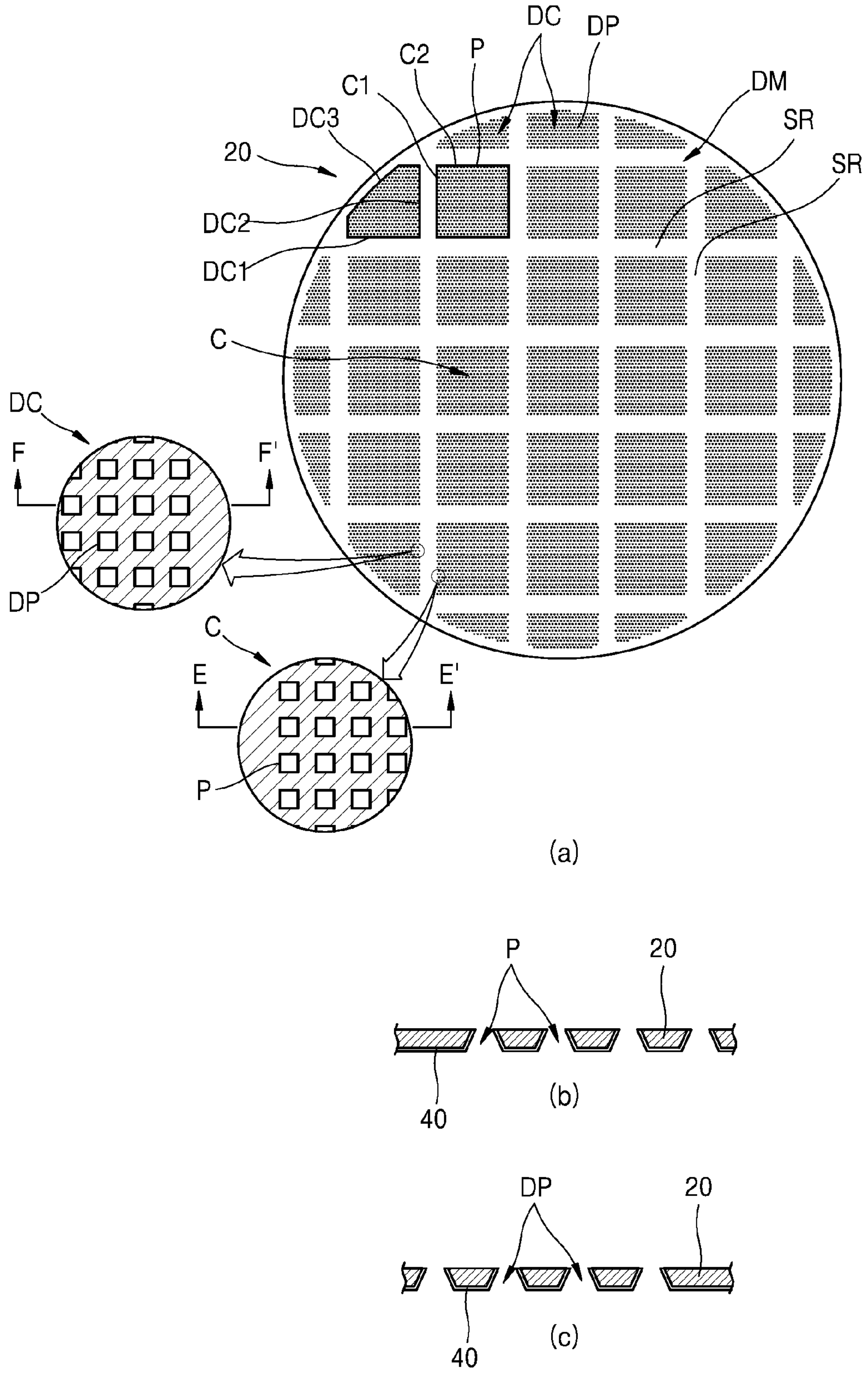
FIG. 17 illustrates a schematic plan view and schematic cross-sectional views taken along, respectively, lines E-E' and F-F' showing a mask according to another embodiment of the present invention.
Figure 18:
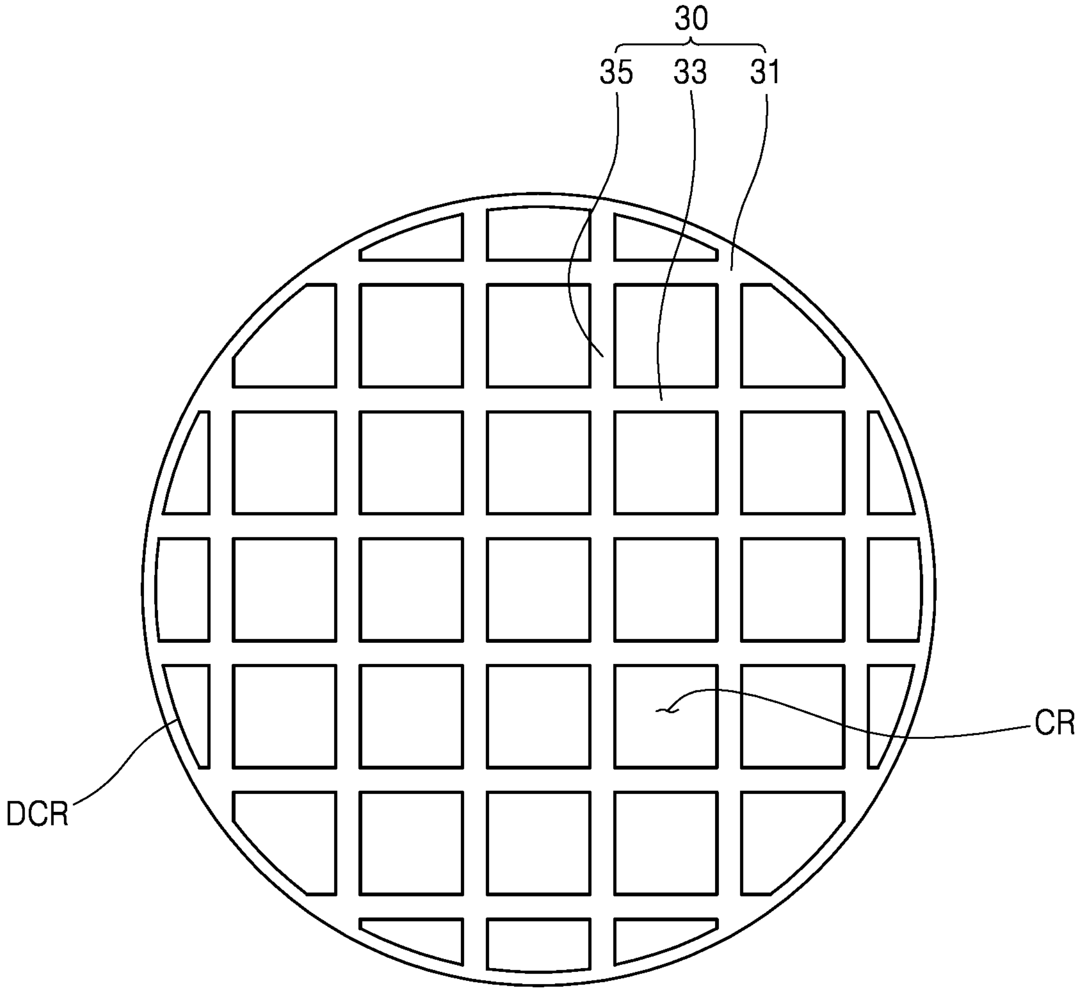
FIG. 18 is a schematic plan view showing a support according to another embodiment of the present invention.

FIG. 17 illustrates a schematic plan view and schematic cross-sectional views taken along, respectively, lines E-E' and F-F' showing a mask 20 according to another embodiment of the present invention. FIG. 18 is a schematic plan view showing a support 30 according to another embodiment of the present invention.

In FIG. 3, the mask 20 may have a circular shaped edge, while the cell portions C including the mask patterns P may have a quadrilateral shape. When the cell portions C are arranged approximately in the central region of the mask 20 along the first and second directions, the distances from each cell portion C to the edge of the circular mask 20 may vary. From another perspective, the area where each cell portion C contacts the dummy portion DM may also vary. Consequently, there may be an issue of uneven stress levels in the regions of the cell portions C and the dummy portion DM of the mask 20.

In addition, while the cell portions C have mask patterns P formed to penetrate the mask 20, the dummy portion DM has no penetrating patterns. Consequently, the dummy portion DM experiences less deformation due to stress, while the cell portions C unavoidably exhibit more significant deformation even under the same stress. The mask-support assembly must ensure that mask patterns P are finely formed and their positions remain unchanged to construct ultra-high-quality OLED pixels with a resolution of 500 to 600 PPI or higher, preferably 2,000 PPI or higher. Therefore, there is a need to uniformly adjust the stress levels acting on both the cell portions C and the dummy portion DM. This requirement may equally apply to the cell regions CR and the dummy cell region DCR of the support 30.

Referring back to FIG. 17, the dummy portion DM of the present invention may include a plurality of dummy cell portions DC. The plurality of dummy cell portions DC may be arranged at predetermined intervals in the first direction (x-axis direction) of the cell portion C and in the second direction (y-axis direction) perpendicular to the first direction. The predetermined interval between the dummy cell portion DC and the cell portion C may correspond to a predetermined interval between the cell portions C. A separation portion SR may also be disposed between the dummy cell portion DC and the cell portion C.

A length of at least one side of the dummy cell portion DC may correspond to a length of one side of the cell portion C. The cell portion C may be provided in a quadrilateral shape, and edge sides C1 and C2 of the cell portion C may be formed as straight lines perpendicular to each other. When the cell portion C is of a square shape, C1 and C2 have the same length, and when the cell portion C is of a rectangular shape, C1 and C2 may have different lengths from each other. The dummy cell region DCR is arranged along the extension of the cell region C in the first and second directions. However, due to its placement at the periphery of the mask 20, it is challenging to provide the dummy cell region DCR in a quadrilateral shape. The dummy cell portion DC may have a shape in which at least some sides have curvature. From another perspective, two to four sides of outer edges DC1, DC2, and DC3 of the dummy cell portion DC may be provided as straight lines, and some sides may be provided as curved lines. In FIG. 17, for example, two outer edges DC1 and DC2 of the uppermost dummy cell portion DC are provided as straight lines and outer edge DC3 is provided as two straight lines and one curved line. In another example, the rightmost/leftmost dummy cell portions DC and the uppermost/lowermost dummy cell portions DC may have a substantially angular "C" shape with three sides provided as straight lines, and the right side thereof is provided as a curved line.

In addition, a plurality of dummy patterns DP may be formed in the dummy cell portion DC. As shown in FIG. 17, the dummy patterns DP may be formed to have the same shape as the mask patterns P. For example, sides of each dummy pattern P may have a sloped shape, a tapered shape, or a shape in which a pattern width gradually increases from the upper part toward the lower part. The plurality of dummy patterns DP may be grouped to form a single dummy cell portion DC. The dummy pattern DP may have a substantially tapered shape, and the pattern width may be several to dozens of micrometers (μm), preferably approximately 5 to 10 μm (resolution of 2,000 PPI or higher).

Meanwhile, the dummy patterns DP may be formed to a specific depth in a predetermined range for the purpose of maintaining uniform stress throughout the entire area of the mask 20, even if they do not penetrate the mask 20 in the thickness direction. Also, the dummy patterns DP may not necessarily have the same shape and size as the mask patterns P, but may be greater than the mask patterns P and may have a shape other than a tapered shape as long as they maintain uniformity of stress throughout the entire area of the mask 20. However, as the shapes of dummy patterns P and the mask patterns P are more identical to each other, the uniformity of stress levels may increase.

Meanwhile, the dummy patterns DP may be provided in a form in which a predetermined region is cut on the dummy portion DM of the mask 20. The dummy pattern DP may not be provided in plural, and may have a continuously connected shape without being regularly and repeatedly formed. For example, the dummy pattern DP may be provided in a form in which only the cell portions C of the mask 20 is left and the remaining portion is cut.

Referring to FIG. 18, a plurality of dummy cell regions DCR may be formed in the support 30. The dummy cell regions DCR may be arranged at predetermined intervals from the cell regions CR in the first direction (x-axis direction) and in the second direction (y-axis direction) that is perpendicular to the first direction. The predetermined interval between the dummy cell region DCR and the cell region CR may correspond to the predetermined interval between the cell regions CR. The first and second grid portions 33 and 35 may also be disposed between the dummy cell regions DCR and the cell regions CR. Since the dummy cell regions DCR serve the same function as the dummy cell portions DC described above, the description thereof will be replaced with the above description of the dummy cell portions DC.

FIG. 19 illustrates schematic views showing a mask planarization process and a dummy trench portion of a grid portion according to an embodiment of the present invention. FIG. 20 illustrates a schematic plan view (a) and a schematic cross-sectional view (b) taken along line G-G' showing a mask pattern and a dummy trench portion of a grid portion according to an embodiment of the present invention.

As shown in (a) of FIG. 19, it is ideal for the upper surface of the mask 20 and the upper surface of the support 30' to have a perfectly identical horizontal plane after the planarization PS process of FIG. 9.

However, as shown in (b) of FIG. 19, when planarization PS such as polishing, buffing, etc., is performed, the upper surface of the mask 20 and the upper surface of the support 30' may not have a perfectly identical height on the horizontal plane, and dishing DS1 and DS2 may occur on the upper part of the mask 20, causing it to become more concave. In this case, the portion of the mask 20 located in the cell portion C has a relatively shallow depth of dishing DS1 because the width of the trench portion TR corresponding to the mask pattern P is narrow, around a few micrometers, to form the mask pattern P. On the other hand, the portion of the mask 20 located in the separation portion SR has a wide width corresponding to several hundred micrometers to several millimeters since it is supported on the first and second grid portions 33 and 35 that are not provided as the mask pattern P. As a result of planarization PS over the wide width, the depth of dishing DS becomes relatively deep. If the depth of dishing DS2 is too deep, the thickness of the mask 20 in the separation portion SR becomes too thin, leading to reduced rigidity and increased susceptibility to deformation, which may adversely affect the alignment of the cell portion C.

Therefore, as shown in (c) of FIG. 19, a dummy trench portion DTR may be formed in the region of the support 30 where the first and second grid portions 33 and 35 are to be formed. The width of the dummy trench portion DTR may be formed to be in the range of several micrometers to hundreds of micrometers, preferably having a narrow width of several micrometers, similar to the scale of the trench portion TR. Consequently, even with planarization PS, the degree of dishing may be uniform across the cell portion C or the separation portion SR, and the separation portion SR and the first and second grid portions 33 and 35 may share the same upper surface.

Referring to FIG. 20, in (b) of FIG. 20, the separation portion SR of the mask 20 is shown accommodated in the dummy trench portion DTR of the second grid portion 35. The separation portion SR is fixed to the dummy trench portion DTR, and an upper part 35*a* of the second grid portion 35 may be anchored through the separation portion SR. Consequently, the dummy trench portion DTR provides an effect of increasing the adhesion to the separation portion SR.

FIG. 21 is a schematic diagram illustrating an OLED pixel deposition apparatus to which a mask-support assembly 10 according to one embodiment of the present invention is applied.

Referring to FIG. 21, an OLED pixel deposition apparatus 1000 includes a magnet plate 1300 in which a magnet 1310 is accommodated and a cooling water line 1350 is disposed, and a deposition source supply 1500 configured to supply organic material sources 1600 from a lower part of the magnet plate 1300.

A target substrate 1900, such as glass, on which the organic material sources 1600 are to be deposited, may be interposed between the magnet plate 1300 and the deposition source supply 1500. The mask-support assembly 10 for enabling deposition of the organic material sources 1600 per pixel may be positioned in contact with or very close to the target substrate 1900. The magnet 1310 may generate a magnetic field and the mask-support assembly 10 may adhere to the target substrate 1900 due to the attraction by the magnetic field.

The deposition source supply 1500 may supply the organic material sources 1600 while horizontally reciprocating, and the organic material source 1600 supplied from the deposition source supply 1500 may pass through mask patterns P formed on the mask-support assembly 10 and be deposited on a surface of the target substrate 1900. The deposited organic material sources 1600 passing through the mask patterns P of the mask-support assembly 10 may serve as a pixel 1700 of an OLED.

The mask pattern P is formed with sloped sides (tapered shape), enabling the organic material sources 1600 to pass along the sloping direction and preventing uneven deposition of OLED pixels 1700 due to the shadow effect.

As described above, the present invention involves forming a frame by processing and connecting the support 30' (or conductive substrate 30') and the mask 20 without applying a separate physical tension to the mask 20 after forming the mask 20 on the support 30' through electroforming, and thus there is no risk of misalignment of the mask. Accordingly, the mask is clearly aligned so that stability of pixel deposition can be improved and at the same time an ultra-high resolution of 2,000 PPI or higher can be realized.

According to the present invention configured as described above, it is possible to achieve ultra-high-resolution pixels for a microdisplay.

In addition, according to the present invention, it is possible to improve the stability of pixel deposition by allowing a mask to be clearly aligned.

In addition, according to the present invention, it is possible to achieve a uniform stress level in all parts of a mask.

However, the scope of the present invention is not limited by the above effects.

While the present invention has been particularly shown and described with reference to embodiments thereof, it will be understood by one of ordinary skill in the art that various changes in form and details may be made therein without departing from the scope of the present invention as defined by the following claims.

REFERENCE NUMERALS

10: MASK-SUPPORT ASSEMBLY
20: MASK
30: SUPPORT
31: EDGE PORTION
33, 35: FIRST GRID PORTION, SECOND GRID PORTION
40: CONNECTION PORTION
1000: OLED PIXEL DEPOSITION APPARATUS
C, SR, DM: CELL PORTION, SEPARATION PORTION, DUMMY PORTION
H: HEAT TREATMENT
P: MASK PATTERN
PS: PLANARIZATION
TR, DTR: TRENCH PORTION, DUMMY TRENCH PORTION

What is claimed is:

1. A mask-support assembly comprising:
a support including an edge portion and a grid portion;
a mask connected onto the support and including a plurality of cell portions with mask patterns formed therein; and
a connection portion interposed between the support and the mask, connecting the support and the mask,
wherein the grid portion includes:
a plurality of first grid portions extending in a first direction and having both ends connected to the edge portion; and
a plurality of second grid portions extending in a second direction perpendicular to the first direction, intersecting with the plurality of first grid portions, and having both ends connected to the edge portion,
wherein at least a part of the mask is disposed in a trench portion recessed in the support,
wherein the support is formed from a silicon wafer, the mask is formed on the silicon wafer by electroforming,
wherein the connection portion comprises components of the support and the mask, and
wherein the support and the mask have a circular shape.

2. The mask-support assembly of claim 1,
wherein the mask comprises:
a dummy portion connected onto the edge portion;
a plurality of cell portions disposed at a central part of the mask and including a plurality of mask patterns; and
separation portions positioned closer to the central part of the mask than the dummy portion and disposed between the plurality of cell portions, and
wherein the separation portions are supported on the grid portion.

3. The mask-support assembly of claim 2,
wherein the dummy portion and the edge portion share a same upper surface.

4. The mask-support assembly of claim 2,
wherein a recessed dummy trench is formed on the grid portion.

5. The mask-support assembly of claim 4,
wherein a portion of the mask corresponding to the separation portion is disposed within a dummy trench portion, allowing the separation portion and the grid portion to share at least a same upper surface.

6. The mask-support assembly of claim 1, wherein the components include Fe, Ni, and Si.

7. The mask-support assembly of claim 1, wherein an auxiliary connection portion including at least one of Ni, Cu, Ti, Au, Ag, Al, Sn, In, Bi, Zn, Sb, Ge, or Cd is further interposed between the connection portion and the mask, and a thickness of the auxiliary connection portion is in a range of 0.01 μm to 0.2 μm.

8. The mask-support assembly of claim 1, wherein a crystal orientation of a (100) plane or (111) plane of the silicon wafer are not be parallel to a longitudinal direction of the plurality of first grid portions or the plurality of second grid portions.

* * * * *